(12) United States Patent
Stoessel et al.

(10) Patent No.: US 8,940,407 B2
(45) Date of Patent: Jan. 27, 2015

(54) ORGANIC ELECTROLUMINESCENT DEVICE

(75) Inventors: Philipp Stoessel, Frankfurt (DE); Esther Breuning, Niedernhausen (DE); Horst Vestweber, Gilserberg (DE); Holger Heil, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 1558 days.

(21) Appl. No.: 11/718,692

(22) PCT Filed: Nov. 3, 2005

(86) PCT No.: PCT/EP2005/011734
§ 371 (c)(1),
(2), (4) Date: May 4, 2007

(87) PCT Pub. No.: WO2006/048268
PCT Pub. Date: May 11, 2006

(65) Prior Publication Data
US 2009/0072712 A1  Mar. 19, 2009

(30) Foreign Application Priority Data
Nov. 6, 2004  (EP) .................................... 04026402

(51) Int. Cl.
 H01L 51/50  (2006.01)
 C09K 11/06  (2006.01)
 H01L 51/00  (2006.01)
 C09B 69/10  (2006.01)

(52) U.S. Cl.
 CPC ............ *C09K 11/06* (2013.01); *H01L 51/0052* (2013.01); *H01L 51/0058* (2013.01); *H01L 51/5012* (2013.01); *C09B 69/101* (2013.01); *C09B 69/102* (2013.01); *C09B 69/109* (2013.01); *Y02E 10/549* (2013.01); *Y10S 428/917* (2013.01)
 USPC ........... 428/690; 428/917; 313/504; 313/505; 313/506; 257/40; 257/E51.05; 257/E51.026; 257/E51.032; 585/27

(58) Field of Classification Search
 USPC .................. 428/690, 917; 313/504, 505, 506; 257/40
 See application file for complete search history.

(56) References Cited

U.S. PATENT DOCUMENTS

| 5,886,183 | A | 3/1999 | Langhals et al. |
| 5,929,239 | A | 7/1999 | Langhals et al. |
| 6,465,115 | B2 * | 10/2002 | Shi et al. ...................... 428/690 |

FOREIGN PATENT DOCUMENTS

| CN | 1362464 | * | 7/2002 | ............. C09K 11/06 |
| EP | 0952200 | A2 | 10/1999 | |
| EP | 952200 | A2 * | 10/1999 | ............. C09K 11/06 |
| EP | 1013740 | A2 | 6/2000 | |

OTHER PUBLICATIONS

Hu et al., "5,11-Dihydro-5,11-di-1-naphthylindolo[3,2-b]carbazole: Atropisomerism in a Novel Hole-Transport Molecule for Organic Light-Emitting Diodes" J. Am. Chem. Soc. 1999, vol. 121, pp. 5097-5098.

* cited by examiner

*Primary Examiner* — Gregory Clark
(74) *Attorney, Agent, or Firm* — Drinker Biddle & Reath LLP

(57) ABSTRACT

The present invention relates to the improvement of organic electronic devices, in particular electroluminescent devices, by using compounds which can have a plurality of isomers, where one of these isomers is present in excess.

26 Claims, 3 Drawing Sheets

UV/VIS and photoluminescence spectra of the atropisomers of A1

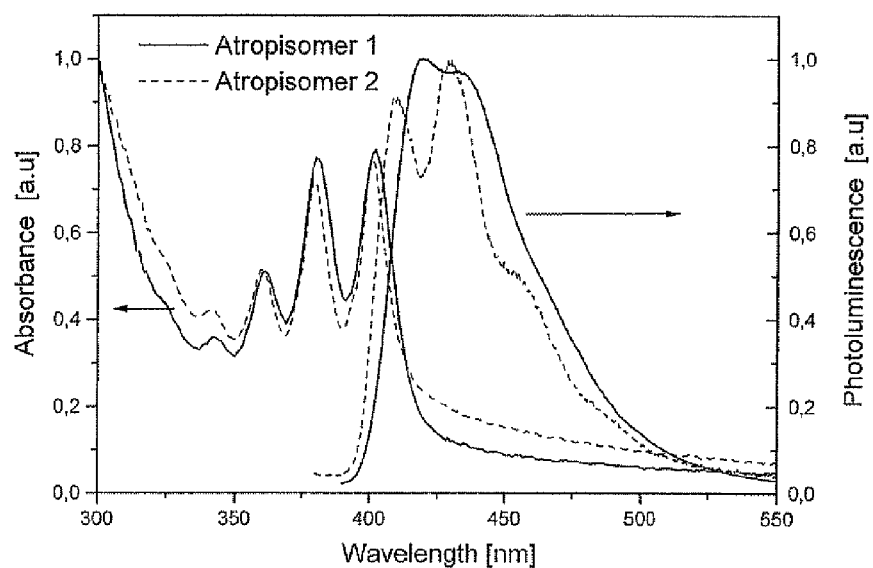
Figure 1: UV/VIS and photoluminescence spectra of the atropisomers of A1
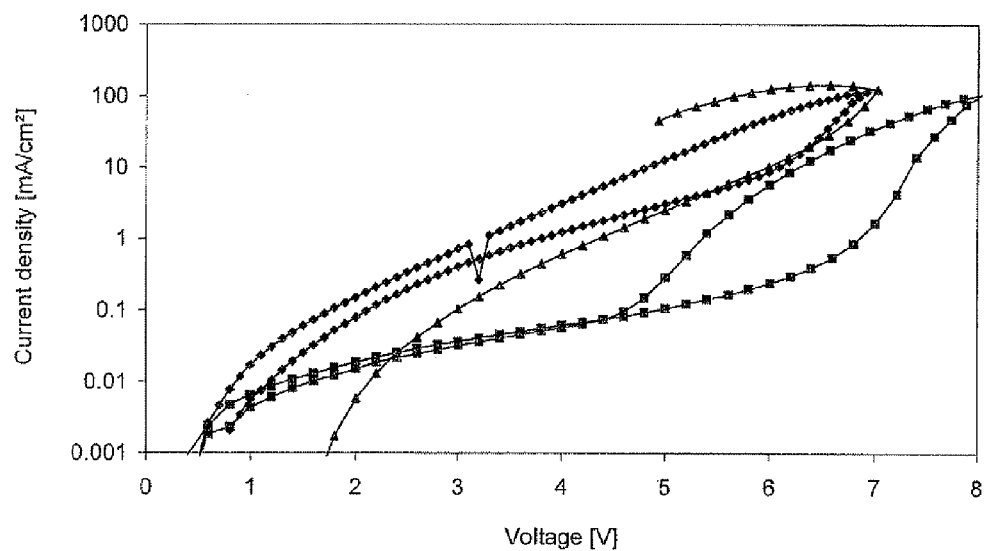
Figure 2: Current density/voltage curves of atropisomers 1 (diamonds) and 2 (triangles) and of the atropisomer mixture (squares) in devices having the following layer structure: ITO / PEDOT 20 nm / A1 40 nm / Ba 4 nm / Al 100 nm.

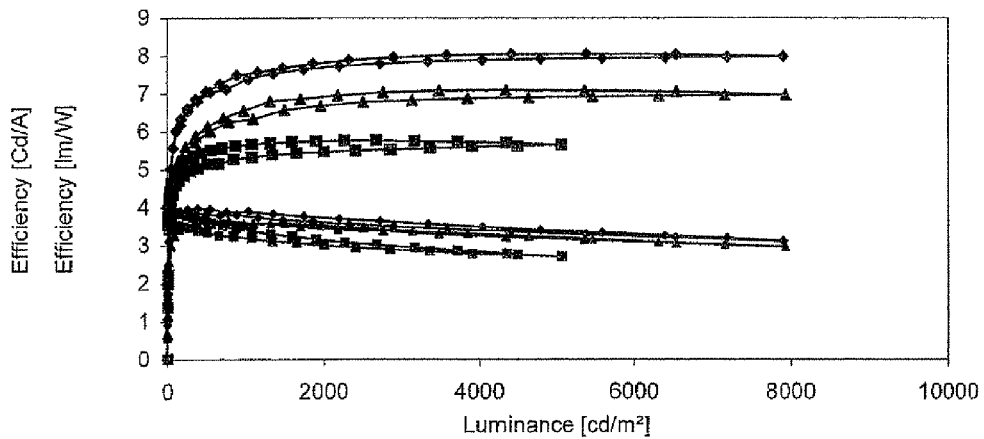

Figure 3: Photometric efficiency in cd/A (upper curve set) and power efficiency in lm/W (lower curve set) as a function of the luminance of atropisomers 1 (diamonds) and 2 (triangles) and of the atropisomer mixture (squares) of A1 in devices having the following layer structure: ITO / PEDOT 20 nm / NaphDATA 20 nm / S-TAD 20 nm / A1 doped with 5% of dopant D1 40 nm / Alq$_3$ 20 nm / LiF 1 nm / Al 100 nm; colour coordinates CIE: x = 0.17, y = 0.31.

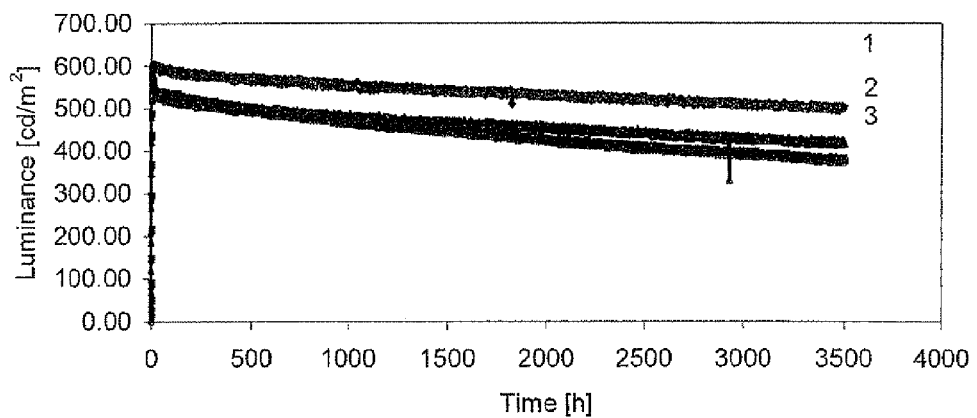

Figure 4: Lifetime curves of the devices of atropisomers 1 (curve 1) and 2 (curve 2) and of the atropisomer mixture (curve 3) of A1 having the following layer structure: ITO / PEDOT 20 nm / NaphDATA 20 nm / S-TAD 20 nm / A1 doped with 5% of dopant D1 40 nm / Alq$_3$ 20 nm / LiF 1 nm / Al 100 nm; colour coordinates CIE: x = 0.17, y = 0.31.

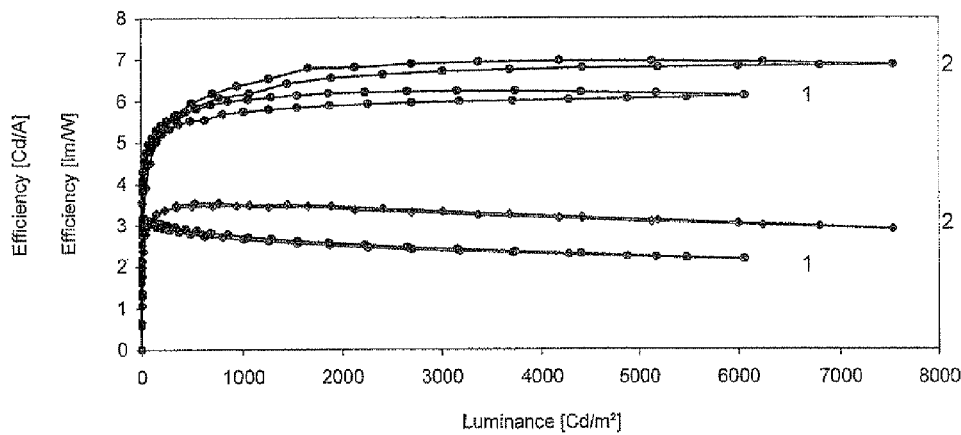

Figure 5: Photometric efficiency in Cd/A (upper curve set) and power efficiency in lm/W (lower curve set) as a function of the luminance of devices having the layer structure indicated below prepared at the beginning of a device preparation (curves 1) and at the end (curves 2) of the same device preparation; layer structure: ITO / PEDOT 20 nm / NaphDATA 20 nm / S-TAD 20 nm / A1 doped with 5% of dopant D1  40 nm / Alq$_3$ 20 nm / LiF 1 nm / Al 100 nm; colour coordinates CIE: x = 0.17, y = 0.31.

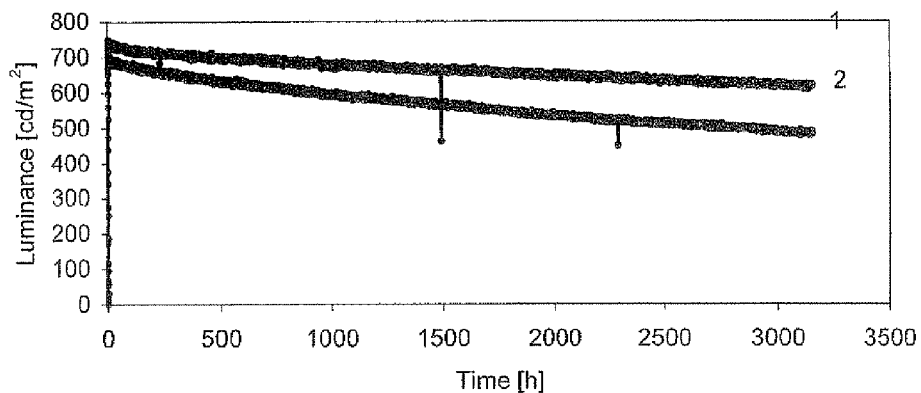

Figure 6: Luminance as a function of time of devices having the layer structure indicated below prepared at the beginning of a device preparation (curve 1) and at the end (curve 2) of the same device preparation; layer structure: ITO / PEDOT 20 nm / NaphDATA 20 nm / S-TAD 20 nm / A1 doped with 5% of dopant D1  40 nm / Alq$_3$ 20 nm / LiF 1 nm / Al 100 nm; colour coordinates CIE: x = 0.17, y = 0.31.

ORGANIC ELECTROLUMINESCENT DEVICE

RELATED APPLICATIONS

This application is a national stage application (under 35 U.S.C. §371) of PCT/EP2005/011734 filed Nov. 3, 2005, which claims benefit of European application 04026402.0 filed Nov. 6, 2004.

The use of organic semiconductors as functional materials has been reality for some time or is expected in the near future in a number of different applications which can be ascribed to the electronics industry in the broadest sense. Thus, organic charge-transport materials (generally hole transporters based on triarylamine) have already been used in photocopiers for many years. The development of organic transistors (O-TFTs, O-FETs), organic integrated circuits (O-ICs) and organic solar cells (O-SCs) is already very far advanced at the research stage, and consequently a market introduction can be expected within the next few years. In the case of organic electroluminescent devices (OLEDs), the market introduction has already taken place, as confirmed, for example, by the car radios from Pioneer or a digital camera from Kodak with an "organic display". Likewise in the case of polymeric light-emitting diodes (PLEDs), first products are available on the market in the form of a small display in a shaver and a mobile telephone from Philips N. V.

However, these devices still exhibit considerable problems which require urgent improvement:
1. The operating lifetime, in particular in the case of blue emission, is still short, meaning that it has to date only been possible to achieve simple applications commercially.
2. In some cases, use is made of mixtures of isomeric compounds, which may have different physical properties (glass transition temperature, glass formation properties, absorption, photoluminescence). Since these stereoisomers in some cases also have different vapour pressures at the processing temperature, uniform, reproducible production of the organic electronic device is impossible. This situation was not recognised as a problem in the literature to date, but results in unreproducible results and thus in considerable deficiencies during the production and operation of the organic electronic devices.
3. The compounds used are in some cases only sparingly soluble in common organic solvents, which makes their purification during the synthesis, but also cleaning of the equipment during the production of the organic electronic devices more difficult.

It would therefore be desirable here to have available compounds which do not have the above-mentioned weaknesses and exhibit the improved properties in the organic electronic devices.

The closest prior art which may be mentioned is the use of various condensed aromatic compounds, such as, for example, anthracene or pyrene derivatives, as host material, in particular for blue-emitting electroluminescent devices.

A host material which is known in accordance with the prior art is, for example, 9,10-bis(2-naphthyl)anthracene (U.S. Pat. No. 5,935,721). Further anthracene derivatives which are suitable as host materials are described, for example, in WO 01/076323, in WO 01/021729, in WO 04/013073, in WO 04/018588, in WO 03/087023 or in WO 04/018587. Host materials based on aryl-substituted pyrenes and chrysenes are described in WO 04/016575, where this application in principle also encompasses corresponding anthracene and phenanthrene derivatives. The use of anthracene derivatives as hole-blocking material is described, for example, in US 2004/0161633. WO 03/095445, CN 1362464 and some other applications and publications also describe, for example, 9,10-bis(1-naphthyl)anthracene derivatives for use in OLEDs. However, none of the descriptions mentioned above discusses the problem of isomerism.

Many of the compounds mentioned in these descriptions exhibit atropisomerism, i.e. stereoisomerism which occurs due to hindered rotation about a single bond, as described in detail below. Examples thereof are the compounds EM5, EM12, EM28, EM32, EM33, EM38, EM39 and EM54 in WO 04/018588 and the compounds AN23, AN24, AN33, AN34, AN35, AN36, AN55 and AN56 in WO 04/018587. None of these descriptions recognises this problem, rather the corresponding compounds are always depicted as planar molecules without discussing the spatial structure. The mixtures of the isomers were apparently always used for the production of the electronic devices. The problems already mentioned above can thus occur: the isomeric forms present in the mixture may have different physical properties (glass transition temperature, morphology, optical and electronic properties, etc.). Since these isomers in some cases also sublime at different temperatures, uniform, reproducible production of the organic electronic devices, in particular, is thus also impossible since different proportions of the isomers are enriched depending on the progress of the sublimation. Apart from differences in the physical properties, this can also result in different film morphology; the reproducibility of the device production is always restricted.

The above-mentioned prior art confirms that the host material plays a crucial role for the properties of organic electroluminescent devices. An analogous situation applies to the materials in other functions or in other layers and also to the materials in other organic electronic devices. It should therefore be possible also further to improve the properties of the organic electronic devices by further optimisation of the materials. Thus, there continues to be a demand for materials, in particular host materials for blue-emitting OLEDs, which result in good efficiencies and at the same time in long lifetimes in organic electronic devices and which lead to reproducible results during the production and operation of the devices. Surprisingly, it has now been found that organic electronic devices comprising atropisomeric compounds which are capable of the formation of diastereomers and comprising one of the possible stereoisomers in excess exhibit significant improvements compared with the prior art. These enriched or isolated materials enable an increase in the efficiency and a lengthening of the lifetime in the organic electronic device compared with the corresponding isomer mixture. In particular, however, these materials enable more reproducible production of organic electronic devices since use is not made of a statistical material mixture whose individual components may have different sublimation temperatures or different further physical properties and whose composition varies during the vapour-deposition process, but instead materials which are highly enriched with individual isomers, or isolated isomers.

N.-X. Hu et al (*J. Am. Chem. Soc.* 1999, 121, 5097) describe the occurrence of atropisomerism in N,N-dinaphth-1-yl-substituted indolocarbazole, which was tested as hole-transport material. The two stereoisomers (one of which is in the form of the racemate) were formed in the synthesis in a ratio of about 1:1, as to be expected for a statistical reaction. The authors were unable to isolate the individual components, but did manage to enrich one of the two isomers. Only the 1:1 isomer mixture was tested in organic electroluminescent devices, but not the enriched form of an isomer, and it is consequently not possible to comment here on the differences on use of an enriched isomer. Without confirming this by experimental results, the authors claim that the use of this 1:1 isomer mixture (in contrast to an isolated isomer) results in advantages since crystallisation would thereby be prevented and the compounds could form a stable glass. This publication causes the reader to form the prejudice that specifically the use of 1:1 mixtures of atropisomeric substances is advantageous compared with the use of enriched or isolated isomers.

U.S. Pat. No. 5,929,239 describes the use of certain enantiomerically pure atropisomers in organic electronic devices. Since the compounds disclosed therein are only able to form enantiomers, but not diastereomers, it is not apparent what advantage the use of enantiomerically pure atropisomers exhibits compared with the racemate, since enantiomers, as is known, have the same physical properties (apart from the interaction with polarised light).

EP 0952200 discloses diphenylanthracene derivatives which are apparently capable, according to the description, of forming stable atropisomers due to high energy barriers to rotation about the single bonds. Our own investigations have shown that these compounds are not able to form room-temperature-stable and isolatable atropisomers, and it is consequently unclear what is meant in this description. Even if these compounds could actually form stable atropisomers, it is not disclosed that the use of individual atropisomers results in advantages over the mixture.

U.S. Pat. No. 5,886,183 describes naphthalene lactam imides which can be used in organic electroluminescent devices and which are able to form atropisomers given suitable substitution. The atropisomers had also been isolated in the case of one compound. However, it is not disclosed that the isolated atropisomers were used in organic electronic devices and the use of the isolated atropisomers rather than the mixture results in better properties of the organic electronic device.

The invention relates to organic electronic devices comprising cathode, anode and at least one layer comprising at least one organic compound which has atropisomerism and is thus capable of the formation of diastereomers, characterised in that an atropisomeric excess of at least 10% is present.

BRIEF DESCRIPTION OF THE DRAWINGS

FIG. 1 shows UV/VIS and photoluminescence spectra of the atropisomers of A1

FIG. 2 shows the current density/voltage curves of atropisomers 1 and 2, and of the atropisomer mixture in the single-layer structure indicated, layer structure: ITO/PEDOT 20 nm/A1 40 nm/Ba 4 nm/A1 100 nm.

FIG. 3 shows the photometric efficiency in cd/A (upper curve set) and power efficiency in lm/W (lower curve set) as a function of the luminance of atropisomers 1 and 2 and of the atropisomer mixture (1:1 parts by weight of atropisomers 1 and 2) in devices having the following layer structure: ITO/PEDOT 20 nm/NaphDATA 20 nm/S-TAD 20 nm/A1 doped with 5% of dopant D1 40 nm/Alq$_3$ 20 nm/LiF 1 nm/A1 100 nm.

FIG. 4 shows lifetime curves of the devices of atropisomers 1 (curve 1) and 2 (curve 2) and of the atropisomer mixture (curve 3) of A1 having the following layer structure: ITO/PEDOT 20 nm/NaphDATA 20 nm/S-TAD 20 nm/A1 doped with 5% of dopant D1 40 nm/Alq$_3$ 20 nm/LiF 1 nm/A1 100 nm; colour coordinates CIE: x=0.17, y=0.31.

FIG. 5 shows the photometric efficiency in cd/A (upper curve set) and power efficiency in lm/W (lower curve set) as a function of the luminance of devices obtained from an atropisomer mixture (1:1 parts by weight of atropisomers 1 and 2) of A1 at the beginning of the device preparation (curves 1) and at the end of the device preparation, after about 90% by weight of the atropisomer mixture employed had evaporated (curves 2).

FIG. 6 shows luminance as a function of time of devices having the layer structure indicated below pre-pared at the beginning of a device preparation (curve 1) and at the end (curve 2) of the same device preparation; layer structure: ITO/PEDOT 20 nm/NaphDATA 20 nm/STAD 20 nm/A1 doped with 5% of dopant D1 40 nm/Alq3 20 nm/LiF 1 nm/A1 100 nm; colour coordinates CIE: x=0.17, y=0.31.

The organic electronic devices are preferably selected from the group of electronic devices consisting of organic and polymeric light-emitting diodes (OLEDs, PLEDs), organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), light-emitting electrochemical cells (LECs) and organic laser diodes (O-lasers). Preference is given to organic and polymeric light-emitting diodes.

Depending on the structure of the compound which has atropisomerism, it can be used in various functions in the organic electronic device, for example as host material for dopants which are able to emit light from the singlet or triplet state, as dopant, as hole-transport material, as electron-transport material or as hole-blocking material. The use of the material having an atropisomeric excess does not differ from the conventional use which is known with isomer mixtures of the respective material. A particularly large number of compounds which exhibit atropisomerism are known to date in the case of host materials for singlet emitters. These are usually pure hydrocarbons and at least usually have a pure hydrocarbon skeleton. In a preferred embodiment of the invention, the host material used is therefore a compound which exhibits atropisomerism, as described above, and has an atropisomeric excess of at least 10%. This applies primarily to organic electroluminescent devices. In other devices, other uses of the materials may also be preferred, for example charge-transport materials in organic field-effect transistors or organic thin-film transistors.

The organic electronic device comprises one or more organic layers, at least one of which comprises at least one compound as described above. In the case of an organic electroluminescent device, at least one organic layer is an emission layer. In the case of organic transistors, at least one organic layer is a charge-transport layer. In organic electroluminescent devices, further layers may also be present in addition to the emitting layer. These may be, for example: hole-injection layer, hole-transport layer, hole-blocking layer, electron-transport layer and/or electron-injection layer. However, it should be pointed out at this point that each of these layers does not necessarily have to be present.

In accordance with the invention, as described above, at least one organic compound which has atropisomerism and is thus capable of the formation of diastereomers is used in the organic electronic device, where an atropisomeric excess of at least 10% is present.

The term isomerism is generally applied to the phenomenon that compounds comprising the same number of identical atoms can differ with respect to the arrangement thereof. Isomers are thus chemical compounds having the same empirical formulae, but different structural formulae. Of importance for this application is stereoisomerism (different spatial arrangement with the same linking), which, in association with the atropisomerism mentioned above and described below in greater detail, can result in enantiomers and/or diastereomers.

According to IUPAC rule E-4.4, the term enantiomeric is applied to molecules (stereoisomers) or chiral groups which behave as image and mirror image to one another and cannot be superimposed on one another. Enantiomers do not differ in their physical properties, i.e. they have the same vapour pressure, the same solubility, the same spectroscopic data, etc. Only the chiroptical properties (interaction with polarised light) are different.

According to IUPAC rule E-4.6, the term diastereomeric is applied to molecules (stereoisomers) which have the same linking (constitution), but do not behave as image and mirror image to one another. Diastereomers cannot be converted into one another by a symmetry operation and may be either chiral or achiral. In contrast to enantiomers, diastereomers differ in their physical and chemical properties.

Conformation is taken to mean the precise spatial arrangement of atoms or atom groups of a molecule of defined linking. Different conformers are produced by rotation about single bonds and cannot be superimposed. If the arrangements produced in this way correspond to an energy minimum, the term conformational isomers or conformers is used. Atropisomerism (definition according to Römpp Lexikon Chemie [Römpp's Lexicon of Chemistry]—Version 2.0, Stuttgart/New York: Georg Thieme Verlag 1999) is taken to mean a form of stereoisomerism in which the stereoisomerism of the molecule is caused by preventing free rotation about a single bond, i.e. by steric hindrance of moieties (i.e. formally conformers with hindered rotation). Depending on the number of single bonds about which rotation is hindered, and depending on substituents present, the compounds may be chiral or achiral, or they are diastereomeric to one another. In the case of atropisomers, an equilibrium generally becomes established if the internal mobility in the molecule is increased by increasing the temperature so that the energy barrier for mutual conversion is overcome. By contrast, no conversion of the isomers is observed at room temperature if the energy barrier is sufficiently large. Atropisomers can generally be isolated if the energy barrier at room temperature is about 80 kJ/mol or more, as is the case, for example, in biphenyl derivatives having sufficiently large substituents in the 2-position (ortho-position). Since any stereogenic axis (rotationally hindered single bond) in atropisomeric compounds can occur in one or other of two possible conformations, there are $2^n$ stereoisomers (diastereomers and enantiomers) for n non-equivalent axes. However, the number of stereoisomers may also be less than $2^n$ if intrinsic symmetry elements mean, for example, that a stereoisomer is achiral or an axis loses its stereogenicity, i.e. a new stereoisomer is not formed on rotation about this axis.

The comments made above on symmetry have various effects on the atropisomerism relevant in this invention:

If atropisomerism is only present about one single bond, enantiomers, but not diastereomers may, where appropriate, occur depending on the substitution. As mentioned above, these have identical physical properties, meaning that the use of an isolated enantiomer offers no advantages. In addition, enantiomers are frequently difficult to separate. This invention therefore only relates to compounds having two or more rotationally hindered single bonds which are capable of the formation of diastereomers, where the moiety between the two rotationally hindered single bonds does not have any further single bonds about which free rotation is possible. If two rotationally hindered single bonds are present, between 1 and 4 isomers may be present, depending on the structure and substitution pattern of the individual moieties. This may be shown diagrammatically for a molecule having the general structure A-B-C (Scheme 1): if moieties A and C are in each case identical and have a symmetrical structure, only a single isomer is possible, even in the case of hindered rotation about the bonds (Scheme 1a), since the conformations do not differ and all conformers can be superimposed on one another. This also applies if, for example, only moiety B or only one of moieties A and C is substituted. If, by contrast, both moieties A and C are substituted or have an asymmetrical structure, where A and C may be identical or different, two atropisomers which are diastereomeric to one another arise (Scheme 1b). These two atropisomers are also known as the syn and anti forms. Each of these two atropisomers is achiral (i.e. can be superimposed on its mirror image), since each has at least one mirror plane in the molecule. If, in addition to identical substituents on A and C, one or more substituents are present on B which make the unit B asymmetrical, there is still only one syn form, while the anti form forms two enantiomers (Scheme 1c). If different substituents are present on A and C instead of identical substituents, four atropisomers form which are diastereomeric or enantiomeric to one another (Scheme 1d). In this case, both the syn form and the anti form each form two enantiomers, where each of the two syn forms is diastereomeric to each of the two anti forms.

Comparable considerations can arise if more than two single bonds with hindered rotation are present, meaning that correspondingly more atropisomers may arise. Similar comments are also present in the literature (for example J. Gawronski, K. Kacprzak, *Chirality* 2002, 14, 689). The precise point groups of the corresponding compounds depend on the exact geometry of the molecules. Thus, the point groups indicated in Scheme 1 are only valid for the diagrammatic drawings depicted there. More precise considerations in this respect are likewise found in the literature cited above.

Scheme 1: Diagrammatic representation of the various possible atropisomers, depending on the substitution of the molecule; a single bond with hindered rotation is in each case present between moieties A, B and C.

a)

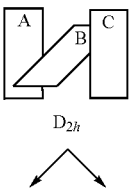

$D_{2h}$

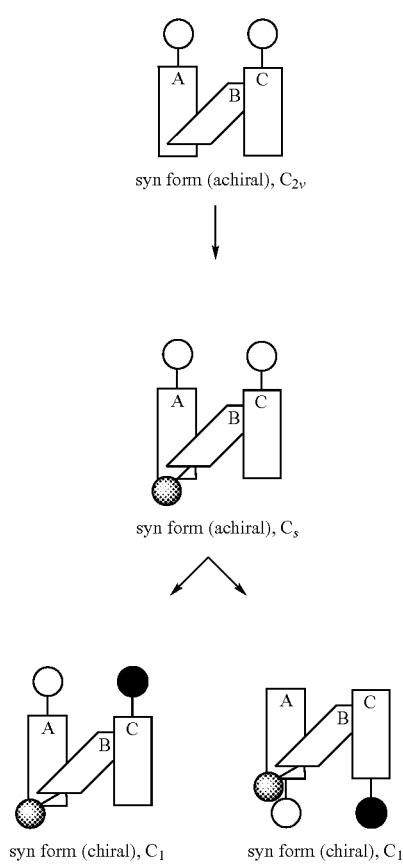

syn form (achiral), $C_{2v}$ syn form (achiral), $C_s$ syn form (chiral), $C_1$    syn form (chiral), $C_1$

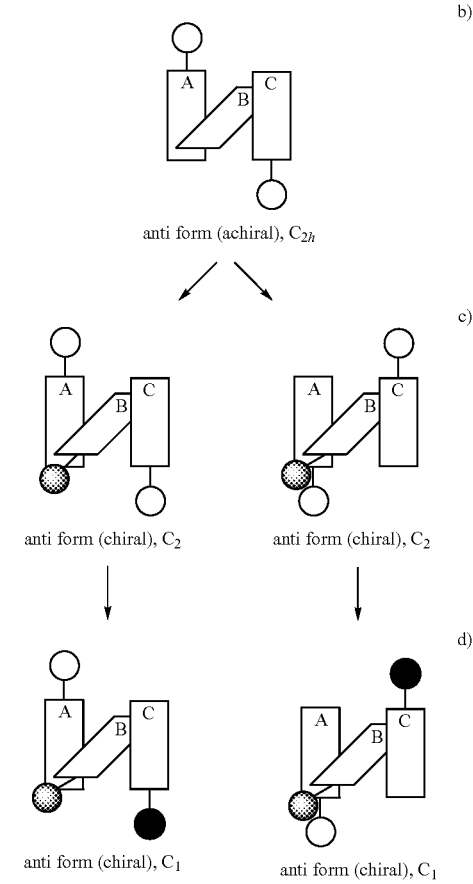

b)

anti form (achiral), $C_{2h}$ c)

anti form (chiral), $C_2$    anti form (chiral), $C_2$ d)

anti form (chiral), $C_1$    anti form (chiral), $C_1$

The atropisomeric excess is defined analogously to the definition of the enantiomeric or diastereomeric excess which is customary in organic chemistry. For the purposes of this invention, atropisomeric excess is intended to be taken to mean:

Atropisomeric excess[%]=[molar proportion (isomer in excess)−molar proportion (isomer not in excess)]×100

This means that an atropisomeric excess of 10% corresponds to a distribution (in the case of two isomers) of 55:45. Some other atropisomeric excesses and the corresponding molar distributions are indicated in Table 1:

TABLE 1

Correlation between atropisomeric excess and molar distribution of the isomers.

| Atropisomeric excess | Molar distribution |
| --- | --- |
| 10% | 55:45 |
| 20% | 60:40 |
| 50% | 75:25 |
| 90% | 95:5 |
| 95% | 97.5:2.5 |
| 99% | 99.5:0.5 |

A special case can arise if more than two atropisomers are possible, for example through the formation of enantiomers, as described in Scheme 1c or 1d, or also if the presence of more than two single bonds with hindered rotation means that more than two diastereomers may be present. In these cases, the atropisomeric excess is intended to be defined as follows for the purposes of this invention:

If diastereomers and enantiomers are present (as in Scheme 1c and 1d), the atropisomeric excess shall be defined as the corresponding diastereomeric excess (and not the enantiomeric excess), irrespective of whether the diastereomer also forms enantiomers or not. It is equally permissible here for the enriched diastereomer to be in the form of the racemate (i.e. both enantiomers in equal proportions) or for one enantiomer to be present in excess or in pure form.

If more than two diastereomers are present, the atropisomeric excess shall be determined analogously to above, where all atropisomers not present in excess are to be considered together as one group. The atropisomeric excess here is thus calculated as follows:

Atropisomeric excess[%]=[molar proportion (isomer in excess)−Σ(molar proportion (isomers not in excess))/number(isomers not in excess)]×100

The atropisomeric excess can be determined using conventional chemical analytical methods, for example by HPLC or by $^1$H-NMR spectroscopy, since diastereomers having different physical properties (different retention times in HPLC, different chemical shift in NMR) are involved. A preferred method is the determination of the atropisomeric excess by HPLC.

In order to be able to isolate stable atropisomers, the activation energy for the rotation about the corresponding single bonds must be at least about 80 kJ/mol. The term "single bond with hindered rotation" used above is thus intended to relate to an activation energy for rotation about this single bond of at least 80 kJ/mol. This activation energy can be determined, for example, by temperature-dependent NMR measurement.

However, since the compounds must also withstand elevated temperatures (for example during recrystallisation or sublimation, but also in the organic electronic device), it is preferred for the activation energy for the rotation about the single bonds to be at least 100 kJ/mol, particularly preferably at least 120 kJ/mol, in particular at least 140 kJ/mol. The activation energy for the rotation about the single bond can be controlled by the precise structure of the compounds and in particular by the substitution. The activation energy for the rotation about the single bond can be determined experimentally by temperature-dependent NMR measurements and can furthermore also be determined by HPLC or GC measurements at elevated temperature.

It is preferred for the atropisomerism to be produced between two $sp^2$ centres and not, for example, between one $sp^2$ and one $sp^3$ centre. It is likewise preferred for the atropisomerism to be produced by hindered rotation about C—C single bonds and not, for example, by hindered rotation about C—N single bonds. This preference is due to the fact that most compounds used as host materials are pure hydrocarbons or at least have a pure hydrocarbon skeleton and therefore, if they have atropisomerism, have the latter about C—C bonds.

As described above, the invention relates to the use of an atropisomeric excess of at least 10%. However, preference is given to a greater atropisomeric excess of at least 20%, particularly preferably at least 50%, very particularly preferably at least 70%, in particular at least 90%, at least 95% or at least 99% respectively. Greater atropisomeric excesses are preferred since better reproducibility is thereby ensured.

In a preferred aspect of the present invention, the compound has precisely two single bonds with hindered rotation, and the atropisomer predominantly present is the syn isomer.

In a further preferred aspect of the present invention, the compound has precisely two single bonds with hindered rotation, and the atropisomer predominantly present is the anti isomer.

In a still further preferred aspect of the present invention, use is made of compounds which have precisely three single bonds with hindered rotation and can therefore have more than the four atropisomers shown in Scheme 1. These single bonds about which atropisomerism is present may have either a linear or branched arrangement.

In a still further preferred aspect of the present invention, use is made of compounds which have precisely four single bonds with hindered rotation and can therefore again have more atropisomers. These single bonds about which atropisomerism is present may have either a linear or branched arrangement.

In a still further preferred aspect of the present invention, use is made of compounds which have more than four single bonds with hindered rotation and can therefore again have more atropisomers. These single bonds about which atropisomerism is present may have either a linear or branched arrangement.

The compound which has atropisomerism is preferably a compound of the formula (1)

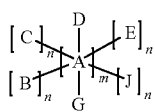

Formula (1)

where the following applies to the symbols and indices:

A is on each occurrence, identically or differently, an aryl or heteroaryl group having 5 to 40 aromatic ring atoms, which may be substituted by R or unsubstituted, with the proviso that a group R is bonded in all ortho-positions to the link to B, C, D, E, G or J (and also to the link to other A, if m>1) or a group B, C, D, E, G or J, or also that this position is blocked by a part of the ring system if A represents a condensed aromatic ring system;

B, C, D, E, G, J are on each occurrence, identically or differently, an aromatic or heteroaromatic ring system having 5 to 40 aromatic ring atoms, which may be unsubstituted or substituted by one or more radicals R, with the proviso that a group R is bonded in at least one ortho-position to the link to A, or also that this position is blocked by a part of the ring system if B, C, D, E, G or J represents a condensed aromatic ring system;

R is on each occurrence, identically or differently, F, Cl, Br, I, CN, $NO_2$, a straight-chain alkyl or alkoxy chain having 1 to 40 C atoms or a branched or cyclic alkyl or alkoxy chain having 3 to 40 C atoms, which may in each case be substituted by $R^1$, in which, in addition, one or more non-adjacent C atoms may be replaced by $N-R^1$, O, S, C=O, O—CO—O, CO—O, SO, $SO_2$, P(=O)$R^1$, Si($R^1$)$_2$, —$CR^1$=$CR^1$— or —C≡C— and in which, in addition, one or more H atoms may be replaced by F, Cl, Br, I or CN, or an aromatic or heteroaromatic ring system having 5 to 40 aromatic ring atoms, which may in addition be substituted by one or more radicals $R^1$, or a combination of two, three, four or five of these systems; two or more radicals R here may also form a further mono- or polycyclic, aliphatic or aromatic ring system with one another;

$R^1$ is on each occurrence, identically or differently, H or an aliphatic or aromatic hydrocarbon radical having 1 to 20 C atoms;

n is on each occurrence, identically or differently, 0 or 1;

m is on each occurrence, identically or differently, 1, 2, 3, 4 or 5, preferably 1, 2 or 3, particularly preferably 1 or 2, very particularly preferably 1.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is particularly preferably taken to mean methoxy, ethoxy, n-propoxy, i-propoxy, n-butoxy, i-butoxy, s-butoxy, t-butoxy or 2-methylbutoxy. An aromatic or heteroaromatic ring system having 5-40 aromatic ring atoms, which may also in each case be substituted by the above-mentioned radicals R and which may be linked to the aromatic or heteroaromatic ring via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment of the invention, at least one carbon atom is bonded to A in all ortho-positions to the link to B, C, D, E, G and J. This may either be part of a condensed ring system (directly on the aromatic or heteroaromatic unit A), or it may be bonded to A as substituent R.

In a further preferred embodiment of the invention, at least one carbon atom is in each case bonded to B, C, D, E, G and J in at least one ortho-position to the link to A. This may either be part of a condensed ring system (directly in the aromatic or heteroaromatic unit B, C, D, E, G or J), or it may be bonded in each case to B, C, D, E, G or J as substituent R.

Particular preference is given to the more stable atropisomers which can be obtained if relatively large groups are present in the ortho-position to the respective link, preferably having at least two C atoms, which may be part of a condensed ring system or of a substituent R.

In a preferred embodiment of the invention, at least one of the groups A, D and/or G (and/or optionally B, C, E and J) is a condensed aromatic ring system. In a preferred embodiment of the invention, A is a condensed aromatic ring system. In a further preferred embodiment, D and G (and optionally also B, C, E and/or J) are condensed aromatic ring systems or ortho-biphenyl. In a particularly preferred embodiment of the invention, A and D and G (and if present also B, C, E and J) are each condensed aromatic ring systems. In a further preferred embodiment of the invention, at least one of groups A, D and/or G (and/or optionally B, C, E and/or J) is a condensed heteroaromatic ring system, and the groups D and/or G (and/or optionally B, C, E and/or J) represent an ortho-biphenyl system.

For the purposes of this invention, an aryl group contains 6 to 40 C atoms; for the purposes of this invention, a heteroaryl group contains 2 to 40 C atoms and at least one heteroatom, with the proviso that the total number of C atoms and heteroatoms is at least 5. The heteroatoms are preferably selected from N, O and/or S. An aryl group or heteroaryl group here is taken to mean either a single aromatic ring, i.e. benzene, or a single heteroaromatic ring, for example pyridine, pyrimidine, thiophene, etc., or a condensed aryl or heteroaryl group in the sense of the definition following below. By contrast, for example, biphenyl, in which a freely rotatable C—C bond is present between the two phenyl units, is not an aryl group for the purposes of this invention.

For the purposes of this invention, an aromatic or heteroaromatic ring system is intended to be taken to mean a system which does not necessarily contain only aromatic or heteroaromatic groups, but instead in which, in addition, a plurality of aromatic or heteroaromatic groups may be interrupted by a short non-aromatic unit (less than 10% of the atoms other than H, preferably less than 5% of the atoms other than H), such as, for example, an $sp^3$-hybridised C, N or O atom. Thus, for example, systems such as 9,9'-spirobifluorene, 9,9-diarylfluorene, triarylamine, etc., are also intended to be taken to mean aromatic ring systems for the purposes of this invention. The aromatic or heteroaromatic ring system here may also be a condensed system in the sense of the following definition.

For the purposes of this invention, condensed aromatic or heteroaromatic ring systems are taken to mean ring systems in which at least two rings, at least one of which is aromatic or heteroaromatic, are "fused" to one another, i.e. condensed onto one another by anellation, i.e. have at least one common edge and a common aromatic $\pi$-electron system. These ring systems may be substituted by R or unsubstituted. Thus, for example, systems such as naphthalene, tetrahydronaphthalene, anthracene, phenanthrene, pyrene, carbazole, etc., are to be regarded as condensed aromatic ring systems, while, for example, biphenyl does not represent a condensed aromatic ring system since there is no common edge between the two ring systems therein.

The condensed aromatic ring systems preferably contain between two and eight aromatic and/or heteroaromatic units, which are in each case condensed onto one another via one or more common edges and thus form a common aromatic system and may be substituted by R or unsubstituted.

The condensed aromatic ring systems particularly preferably contain between two and six heteroaromatic or preferably aromatic units, in particular two, three or four aromatic units, which are in each case condensed onto one another via one or more common edges and thus form a common aromatic system and may be substituted by R or unsubstituted.

The aromatic and heteroaromatic units condensed onto one another are very particularly preferably selected from benzene, pyridine, pyrimidine, pyrazine, pyridazine, pyrrole, furan and thiophene, each of which may be substituted by R or unsubstituted, in particular benzene and pyridine.

The condensed aromatic ring systems are preferably selected from the group consisting of naphthalene, anthracene, phenanthrene, pyrene, naphthacene, chrysene, pentacene, quinoline, isoquinoline, quinoxaline, phenanthroline, perylene, triphenylene, carbazole, benzothiophene and dibenzothiophene, each of which may optionally be substituted by R. The condensed aromatic ring systems are particularly preferably selected from the group consisting of naphthalene, anthracene, phenanthrene, pyrene and perylene, each of which may optionally be substituted by R, in particular naphthalene, anthracene, phenanthrene and pyrene. The substitution by R may be appropriate, in particular, in order to raise the activation energy for the rotation about the corresponding single bond and thus to obtain more stable isomers. The substitution may furthermore be appropriate in order to obtain compounds with better solubility. In particular, the substitution may also help to differentiate between different atropisomers, since the properties of the two isomers, for example the solubility and/or the polarity, change to different extents due to the substituents depending on the compound, enabling the separation of the two isomers to be simplified.

In a particularly preferred embodiment of the invention, the symbol A stands for a 9,10-linked anthracene unit. Due to the type of linking, this already has sufficiently large groups in the ortho-position to the link, meaning that further substituents on this unit are not absolutely necessary here in order to facilitate stable atropisomers. In a further preferred embodiment of the invention, the symbol A stands for a pyrene unit.

Examples of suitable compounds which form atropisomers are structures 1 to 17 depicted below, where in each case Example a shows the syn form and Example b the anti form and where in each case both (or all) possible atropisomers in enriched or preferably pure form are suitable for use in organic electronic devices. The bonds depicted in bold here indicate the moieties which are above the plane defined by the central unit.

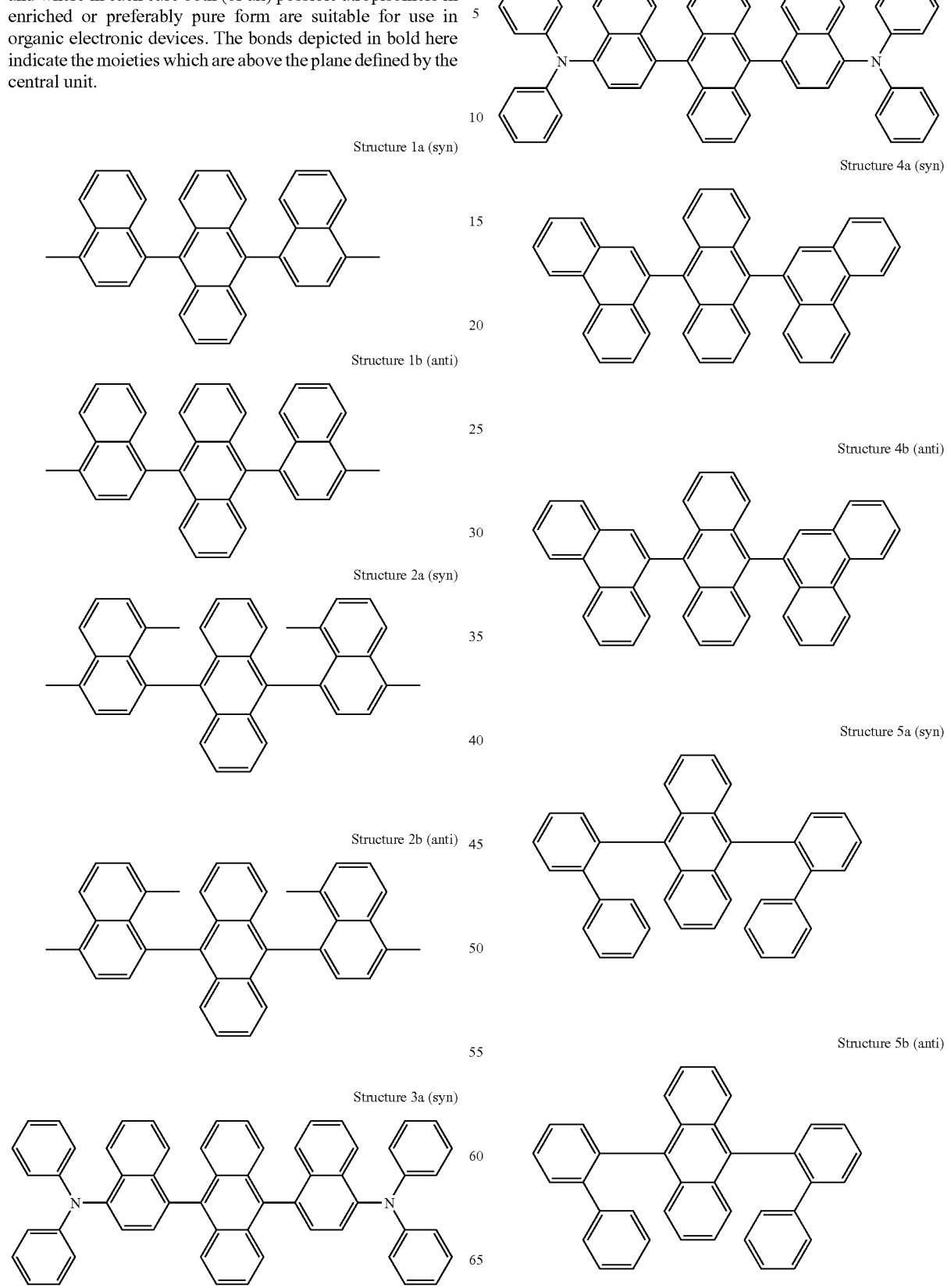

Structure 6a (syn)
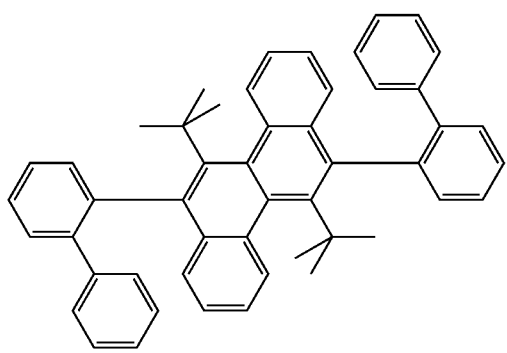
Structure 6b (anti)
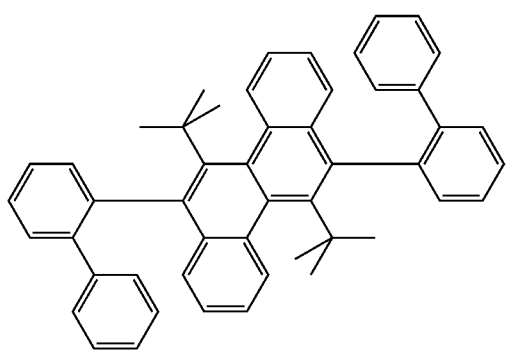
Structure 7a (syn)
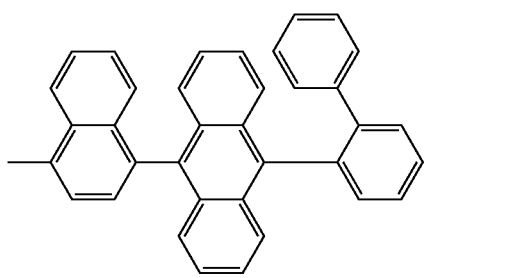
Structure 7b (anti)
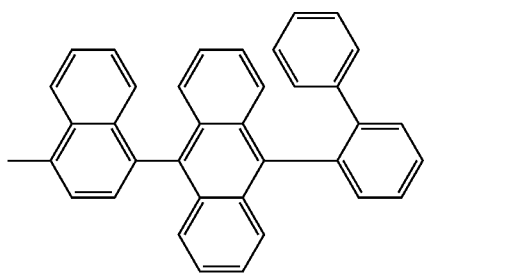
Structure 8a (syn)
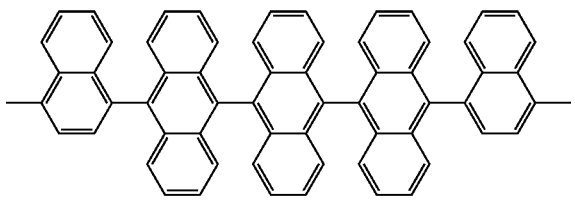
Structure 8b (anti)
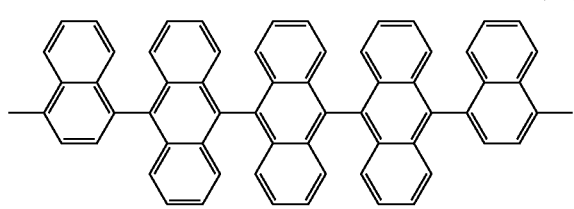
Structure 9a (syn)
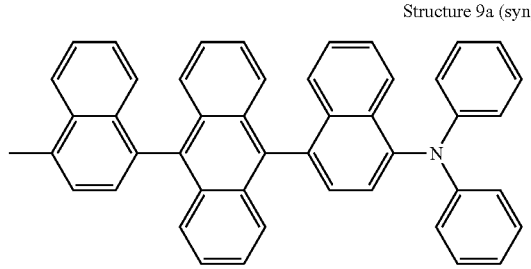
Structure 9b (anti)
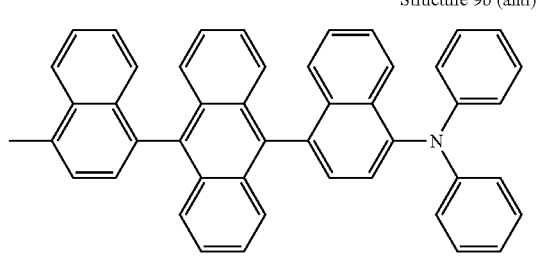
Structure 10a (syn)
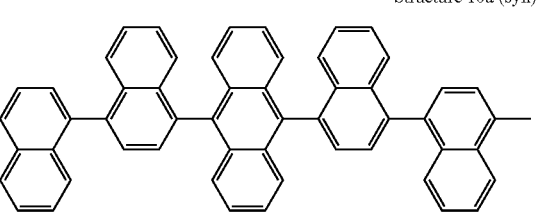
Structure 10b (anti)
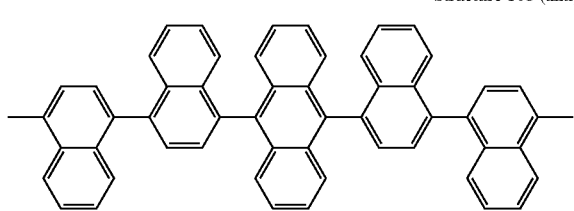
Structure 11a (syn)
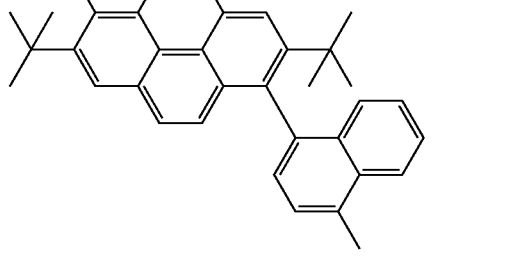

Structure 11b (anti)
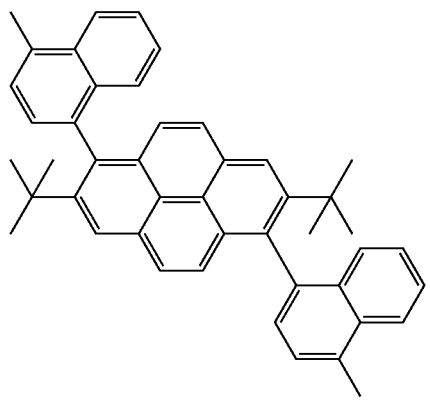
Structure 12a (syn-syn-syn)
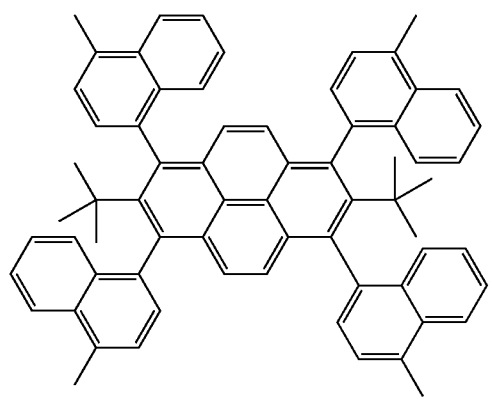
Structure 12b (anti-anti-anti)
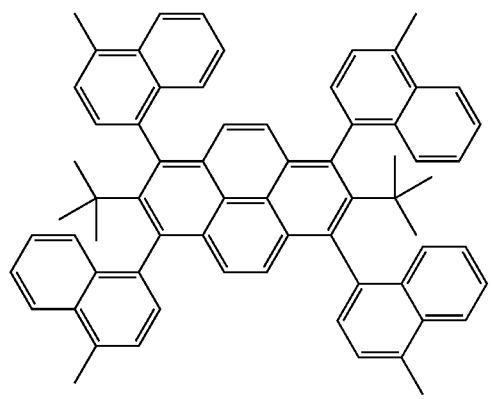
Structure 13a (syn-syn-syn)
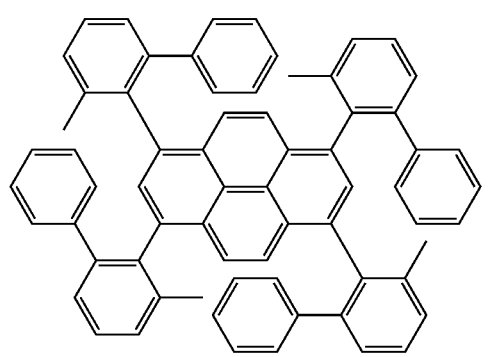
Structure 13b (anti-anti-anti)
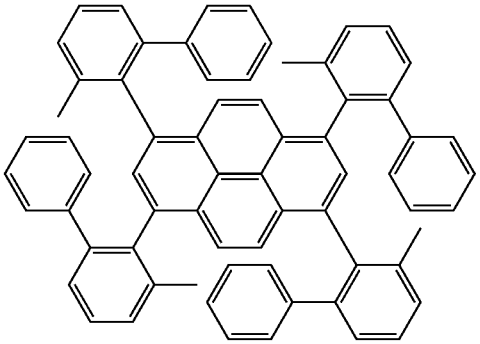
Structure 14a (syn-syn)
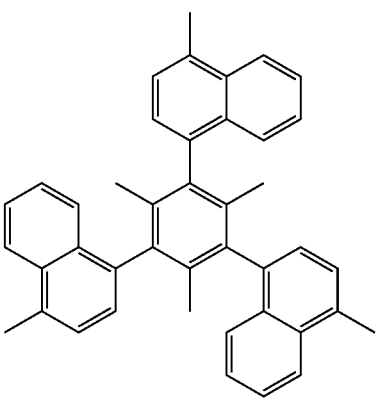
Structure 14b (syn-anti)
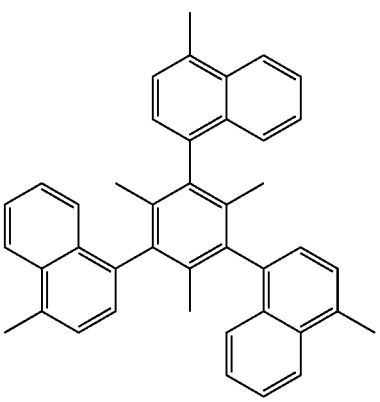
Structure 15a (syn)
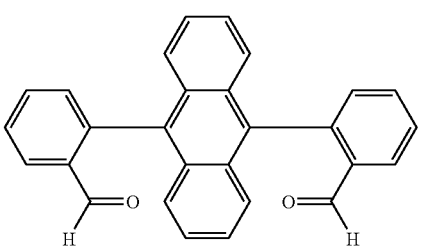

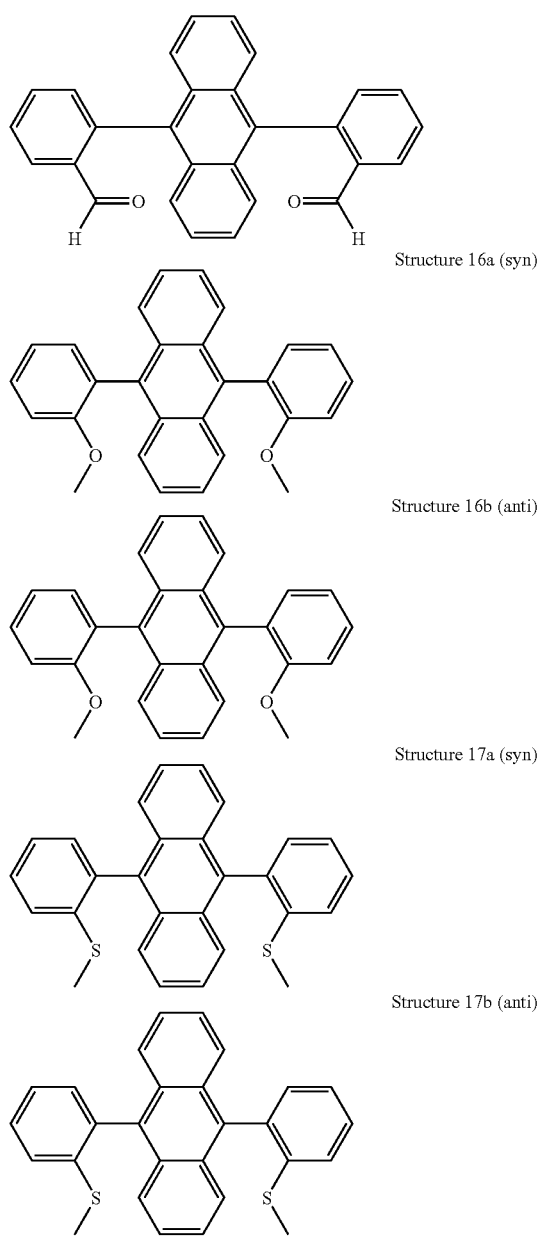

Structure 15b (anti)
Structure 16a (syn)
Structure 16b (anti)
Structure 17a (syn)
Structure 17b (anti)

Further preferred compounds which have atropisomerism about C—C bonds and are capable of the formation of diastereomers are any of structural units (A1) to (A15) depicted below, which can be combined with any of structural units (D1) to (D12) and (G1) to (G12). The dashed bond here in each case denotes the link to the other units of the formula (1).

The radicals $R_a$ on units (A1) to (A3), (A10) and (A11) are preferably selected from the group consisting of methyl, tert-butyl, phenyl, ortho-tolyl, meta-tolyl, para-tolyl, ortho-fluorophenyl, meta-fluorophenyl, para-fluorophenyl, 1-naphthyl, 2-naphthyl, ortho-xylyl, meta-xylyl, para-xylyl and mesityl. The radicals $R_a$ on units (A4) to (A9) and (A12) to (A15) are preferably selected from the group consisting of methyl, tert-butyl, fluorine, phenyl, ortho-tolyl, meta-tolyl, para-tolyl, ortho-fluorophenyl, meta-fluorophenyl, para-fluorophenyl, 1-naphthyl, 2-naphthyl, ortho-xylyl, meta-xylyl, para-xylyl, mesityl, N(phenyl)$_2$, N(p-tolyl)$_2$, N(1-naphthyl)$_2$, N(2-naphthyl)$_2$ and N(p-fluoro-phenyl)$_2$.

At least one of the radicals $R_d$ on units (D1) to (D4) and (G1) to (G4) in the ortho-position to the link of group D to A or of G to A is preferably selected from the group consisting of tert-butyl, N(phenyl)$_2$, N(p-tolyl)$_2$, N(1-naphthyl)$_2$, N(2-naphthyl)$_2$, N(p-fluorophenyl)$_2$, phenyl, ortho-tolyl, meta-tolyl, para-tolyl, ortho-fluorophenyl, meta-fluorophenyl, para-fluorophenyl, 1-naphthyl, 2-naphthyl, ortho-xylyl, meta-xylyl, para-xylyl and mesityl. The other radicals $R_d$ on units (D1) to (D4) and (G1) to (G4) and on units (D5) to (D12) and (G5) to (G12) are preferably selected from the group consisting of methyl, tert-butyl, fluorine, N(phenyl)$_2$, N(p-tolyl)$_2$, N(1-naphthyl)$_2$, N(2-naphthyl)$_2$, N(p-fluorophenyl)$_2$, phenyl, ortho-tolyl, meta-tolyl, para-tolyl, ortho-fluorophenyl, meta-fluorophenyl, para-fluorophenyl, 1-naphthyl, 2-naphthyl, ortho-xylyl, meta-xylyl, para-xylyl and mesityl, where the two substituents $R_d$ in the ortho-position to the link of group D to A or of G to A in units (D2) and (G2) are selected differently. Furthermore, the radicals $R_d$ in the para-position to the link of group D to A or of G to A on units (D1), (G1), (D2), (G2), (D3), (G3), (D9) to (D12) and (G9) to (G12) may also be hydrogen. Furthermore, the radicals $R_a$ on units (D3), (G3), (D11) and (G11) may also be hydrogen.

Units A:

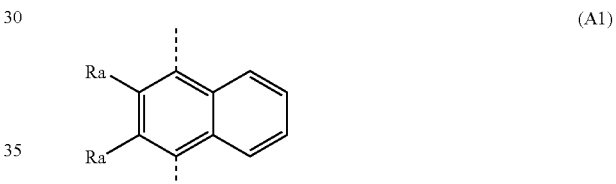

(A1)

(A2)

(A3)

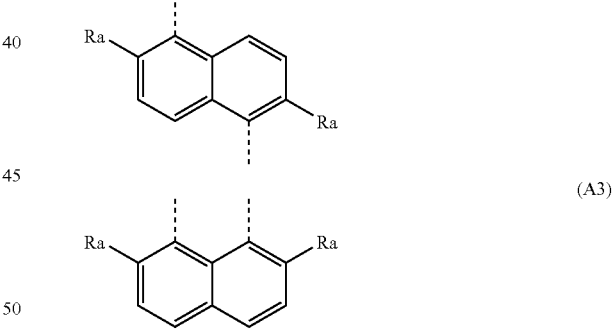

(A4)

(A5)

-continued
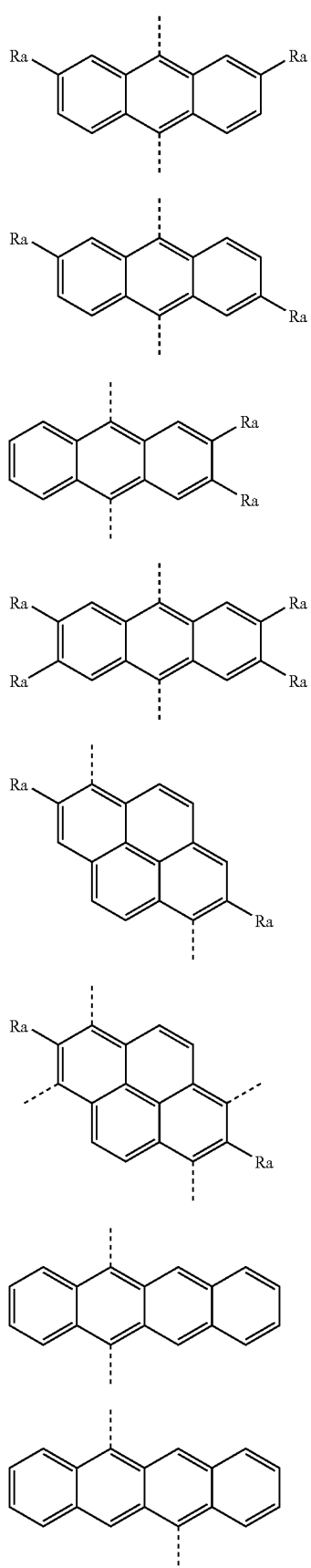
(A6)
(A7)
(A8)
(A9)
(A10)
(A11)
(A12)
(A13)
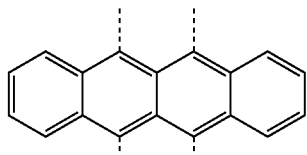
(A14)
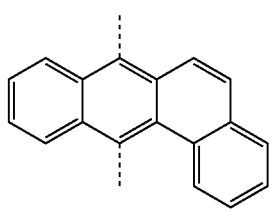
(A15)
Units D and G:
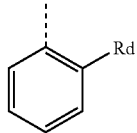
(D1) (G1)
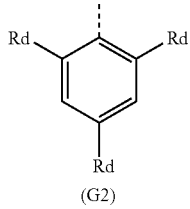
(D2) (G2)
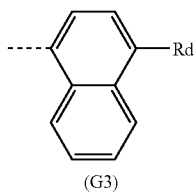
(D3) (G3)
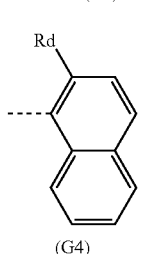
(D4) (G4)
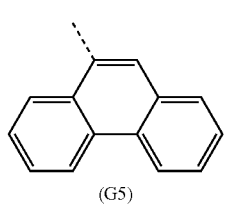
(D5) (G5)

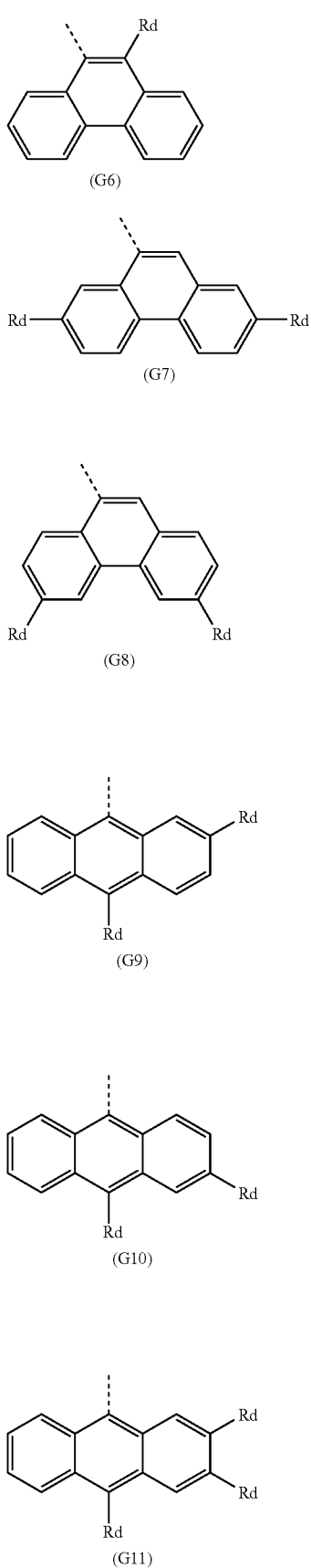
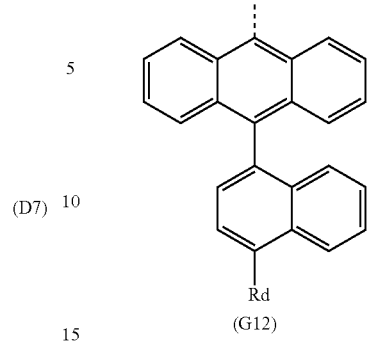

Particular preference is given to the structures shown in Table 2, each of which is substituted by the above-mentioned radicals $R_a$ or $R_d$ in the above-mentioned positions.

TABLE 2

Particularly preferred structures

| No. | Stereochemistry | A | D | G |
|---|---|---|---|---|
| 1 | syn | (A1) | (D1) | (G1) |
| 2 | anti | (A1) | (D1) | (G1) |
| 3 | syn | (A1) | (D1) | (G2) |
| 4 | anti | (A1) | (D1) | (G2) |
| 5 | syn | (A1) | (D1) | (G3) |
| 6 | anti | (A1) | (D1) | (G3) |
| 7 | syn | (A1) | (D1) | (G9) |
| 8 | anti | (A1) | (D1) | (G9) |
| 9 | syn | (A1) | (D1) | (G10) |
| 10 | anti | (A1) | (D1) | (G10) |
| 11 | syn | (A1) | (D1) | (G11) |
| 12 | anti | (A1) | (D1) | (G11) |
| 13 | syn | (A1) | (D1) | (G12) |
| 14 | anti | (A1) | (D1) | (G12) |
| 15 | syn | (A1) | (D2) | (G2) |
| 16 | anti | (A1) | (D2) | (G2) |
| 17 | syn | (A1) | (D2) | (G3) |
| 18 | anti | (A1) | (D2) | (G3) |
| 19 | syn | (A1) | (D2) | (G9) |
| 20 | anti | (A1) | (D2) | (G9) |
| 21 | syn | (A1) | (D2) | (G10) |
| 22 | anti | (A1) | (D2) | (G10) |
| 23 | syn | (A1) | (D2) | (G11) |
| 24 | anti | (A1) | (D2) | (G11) |
| 25 | syn | (A1) | (D2) | (G12) |
| 26 | anti | (A1) | (D2) | (G12) |
| 27 | syn | (A1) | (D3) | (G3) |
| 28 | anti | (A1) | (D3) | (G3) |
| 29 | syn | (A1) | (D3) | (G9) |
| 30 | anti | (A1) | (D3) | (G9) |
| 31 | syn | (A1) | (D3) | (G10) |
| 32 | anti | (A1) | (D3) | (G10) |
| 33 | syn | (A1) | (D3) | (G11) |
| 34 | anti | (A1) | (D3) | (G11) |
| 35 | syn | (A1) | (D3) | (G12) |
| 36 | anti | (A1) | (D3) | (G12) |
| 37 | syn | (A1) | (D9) | (G9) |
| 38 | anti | (A1) | (D9) | (G9) |
| 39 | syn | (A1) | (D9) | (G10) |
| 40 | anti | (A1) | (D9) | (G10) |
| 41 | syn | (A1) | (D9) | (G11) |
| 42 | anti | (A1) | (D9) | (G11) |
| 43 | syn | (A1) | (D9) | (G12) |
| 44 | anti | (A1) | (D9) | (G12) |
| 45 | syn | (A1) | (D10) | (G10) |
| 46 | anti | (A1) | (D10) | (G10) |
| 47 | syn | (A1) | (D10) | (G11) |
| 48 | anti | (A1) | (D10) | (G11) |
| 49 | syn | (A1) | (D10) | (G12) |
| 50 | anti | (A1) | (D10) | (G12) |
| 51 | syn | (A1) | (D11) | (G11) |

TABLE 2-continued

Particularly preferred structures

| No. | Stereochemistry | A | D | G |
|---|---|---|---|---|
| 52 | anti | (A1) | (D11) | (G11) |
| 53 | syn | (A1) | (D11) | (G12) |
| 54 | anti | (A1) | (D11) | (G12) |
| 55 | syn | (A1) | (D12) | (G12) |
| 56 | anti | (A1) | (D12) | (G12) |
| 57 | syn | (A4) | (D1) | (G1) |
| 58 | anti | (A4) | (D1) | (G1) |
| 59 | syn | (A4) | (D1) | (G2) |
| 60 | anti | (A4) | (D1) | (G2) |
| 61 | syn | (A4) | (D1) | (G3) |
| 62 | anti | (A4) | (D1) | (G3) |
| 63 | syn | (A4) | (D1) | (G9) |
| 64 | anti | (A4) | (D1) | (G9) |
| 65 | syn | (A4) | (D1) | (G10) |
| 66 | anti | (A4) | (D1) | (G10) |
| 67 | syn | (A4) | (D1) | (G11) |
| 68 | anti | (A4) | (D1) | (G11) |
| 69 | syn | (A4) | (D1) | (G12) |
| 70 | anti | (A4) | (D1) | (G12) |
| 71 | syn | (A4) | (D2) | (G2) |
| 72 | anti | (A4) | (D2) | (G2) |
| 73 | syn | (A4) | (D2) | (G3) |
| 74 | anti | (A4) | (D2) | (G3) |
| 75 | syn | (A4) | (D2) | (G9) |
| 76 | anti | (A4) | (D2) | (G9) |
| 77 | syn | (A4) | (D2) | (G10) |
| 78 | anti | (A4) | (D2) | (G10) |
| 79 | syn | (A4) | (D2) | (G11) |
| 80 | anti | (A4) | (D2) | (G11) |
| 81 | syn | (A4) | (D2) | (G12) |
| 82 | anti | (A4) | (D2) | (G12) |
| 82 | syn | (A4) | (D3) | (G3) |
| 84 | anti | (A4) | (D3) | (G3) |
| 85 | syn | (A4) | (D3) | (G9) |
| 86 | anti | (A4) | (D3) | (G9) |
| 87 | syn | (A4) | (D3) | (G10) |
| 88 | anti | (A4) | (D3) | (G10) |
| 89 | syn | (A4) | (D3) | (G11) |
| 90 | anti | (A4) | (D3) | (G11) |
| 91 | syn | (A4) | (D3) | (G12) |
| 92 | anti | (A4) | (D3) | (G12) |
| 93 | syn | (A4) | (D9) | (G9) |
| 94 | anti | (A4) | (D9) | (G9) |
| 95 | syn | (A4) | (D9) | (G10) |
| 96 | anti | (A4) | (D9) | (G10) |
| 97 | syn | (A4) | (D9) | (G11) |
| 98 | anti | (A4) | (D9) | (G11) |
| 99 | syn | (A4) | (D9) | (G12) |
| 100 | anti | (A4) | (D9) | (G12) |
| 101 | syn | (A4) | (D10) | (G10) |
| 102 | anti | (A4) | (D10) | (G10) |
| 103 | syn | (A4) | (D10) | (G11) |
| 104 | anti | (A4) | (D10) | (G11) |
| 105 | syn | (A4) | (D10) | (G12) |
| 106 | anti | (A4) | (D10) | (G12) |
| 107 | syn | (A4) | (D11) | (G11) |
| 108 | anti | (A4) | (D11) | (G11) |
| 109 | syn | (A4) | (D11) | (G12) |
| 110 | anti | (A4) | (D11) | (G12) |
| 111 | syn | (A4) | (D12) | (G12) |
| 112 | anti | (A4) | (D12) | (G12) |
| 113 | syn | (A5) | (D1) | (G1) |
| 114 | anti | (A5) | (D1) | (G1) |
| 115 | syn | (A5) | (D1) | (G2) |
| 116 | anti | (A5) | (D1) | (G2) |
| 117 | syn | (A5) | (D1) | (G3) |
| 118 | anti | (A5) | (D1) | (G3) |
| 119 | syn | (A5) | (D1) | (G9) |
| 120 | anti | (A5) | (D1) | (G9) |
| 121 | syn | (A5) | (D1) | (G10) |
| 122 | anti | (A5) | (D1) | (G10) |
| 123 | syn | (A5) | (D1) | (G11) |
| 124 | anti | (A5) | (D1) | (G11) |
| 125 | syn | (A5) | (D1) | (G12) |
| 126 | anti | (A5) | (D1) | (G12) |
| 127 | syn | (A5) | (D2) | (G2) |
| 128 | anti | (A5) | (D2) | (G2) |
| 129 | syn | (A5) | (D2) | (G3) |
| 130 | anti | (A5) | (D2) | (G3) |
| 131 | syn | (A5) | (D2) | (G9) |
| 132 | anti | (A5) | (D2) | (G9) |
| 133 | syn | (A5) | (D2) | (G10) |
| 134 | anti | (A5) | (D2) | (G10) |
| 135 | syn | (A5) | (D2) | (G11) |
| 136 | anti | (A5) | (D2) | (G11) |
| 137 | syn | (A5) | (D2) | (G12) |
| 138 | anti | (A5) | (D2) | (G12) |
| 139 | syn | (A5) | (D3) | (G3) |
| 140 | anti | (A5) | (D3) | (G3) |
| 141 | syn | (A5) | (D3) | (G9) |
| 142 | anti | (A5) | (D3) | (G9) |
| 143 | syn | (A5) | (D3) | (G10) |
| 144 | anti | (A5) | (D3) | (G10) |
| 145 | syn | (A5) | (D3) | (G11) |
| 146 | anti | (A5) | (D3) | (G11) |
| 147 | syn | (A5) | (D3) | (G12) |
| 148 | anti | (A5) | (D3) | (G12) |
| 149 | syn | (A5) | (D9) | (G9) |
| 150 | anti | (A5) | (D9) | (G9) |
| 151 | syn | (A5) | (D9) | (G10) |
| 152 | anti | (A5) | (D9) | (G10) |
| 153 | syn | (A5) | (D9) | (G11) |
| 154 | anti | (A5) | (D9) | (G11) |
| 155 | syn | (A5) | (D9) | (G12) |
| 156 | anti | (A5) | (D9) | (G12) |
| 157 | syn | (A5) | (D10) | (G10) |
| 158 | anti | (A5) | (D10) | (G10) |
| 159 | syn | (A5) | (D10) | (G11) |
| 160 | anti | (A5) | (D10) | (G11) |
| 161 | syn | (A5) | (D10) | (G12) |
| 162 | anti | (A5) | (D10) | (G12) |
| 163 | syn | (A5) | (D11) | (G11) |
| 164 | anti | (A5) | (D11) | (G11) |
| 165 | syn | (A5) | (D11) | (G12) |
| 166 | anti | (A5) | (D11) | (G12) |
| 167 | syn | (A5) | (D12) | (G12) |
| 168 | anti | (A5) | (D12) | (G12) |
| 169 | syn | (A9) | (D1) | (G1) |
| 170 | anti | (A9) | (D1) | (G1) |
| 171 | syn | (A9) | (D1) | (G2) |
| 172 | anti | (A9) | (D1) | (G2) |
| 173 | syn | (A9) | (D1) | (G3) |
| 174 | anti | (A9) | (D1) | (G3) |
| 175 | syn | (A9) | (D1) | (G9) |
| 176 | anti | (A9) | (D1) | (G9) |
| 177 | syn | (A9) | (D1) | (G10) |
| 178 | anti | (A9) | (D1) | (G10) |
| 179 | syn | (A9) | (D1) | (G11) |
| 180 | anti | (A9) | (D1) | (G11) |
| 181 | syn | (A9) | (D1) | (G12) |
| 182 | anti | (A9) | (D1) | (G12) |
| 183 | syn | (A9) | (D2) | (G2) |
| 184 | anti | (A9) | (D2) | (G2) |
| 185 | syn | (A9) | (D2) | (G3) |
| 186 | anti | (A9) | (D2) | (G3) |
| 187 | syn | (A9) | (D2) | (G9) |
| 188 | anti | (A9) | (D2) | (G9) |
| 189 | syn | (A9) | (D2) | (G10) |
| 190 | anti | (A9) | (D2) | (G10) |
| 191 | syn | (A9) | (D2) | (G11) |
| 192 | anti | (A9) | (D2) | (G11) |
| 193 | syn | (A9) | (D2) | (G12) |
| 194 | anti | (A9) | (D2) | (G12) |
| 195 | syn | (A9) | (D3) | (G3) |
| 196 | anti | (A9) | (D3) | (G3) |
| 197 | syn | (A9) | (D3) | (G9) |
| 198 | anti | (A9) | (D3) | (G9) |
| 199 | syn | (A9) | (D3) | (G10) |
| 200 | anti | (A9) | (D3) | (G10) |
| 201 | syn | (A9) | (D3) | (G11) |
| 202 | anti | (A9) | (D3) | (G11) |
| 203 | syn | (A9) | (D3) | (G12) |

TABLE 2-continued

Particularly preferred structures

| No. | Stereochemistry | A | D | G |
|---|---|---|---|---|
| 204 | anti | (A9) | (D3) | (G12) |
| 205 | syn | (A9) | (D9) | (G9) |
| 206 | anti | (A9) | (D9) | (G9) |
| 207 | syn | (A9) | (D9) | (G10) |
| 208 | anti | (A9) | (D9) | (G10) |
| 209 | syn | (A9) | (D9) | (G11) |
| 210 | anti | (A9) | (D9) | (G11) |
| 211 | syn | (A9) | (D9) | (G12) |
| 212 | anti | (A9) | (D9) | (G12) |
| 213 | syn | (A9) | (D10) | (G10) |
| 214 | anti | (A9) | (D10) | (G10) |
| 215 | syn | (A9) | (D10) | (G11) |
| 216 | anti | (A9) | (D10) | (G11) |
| 217 | syn | (A9) | (D10) | (G12) |
| 218 | anti | (A9) | (D10) | (G12) |
| 219 | syn | (A9) | (D11) | (G11) |
| 220 | anti | (A9) | (D11) | (G11) |
| 221 | syn | (A9) | (D11) | (G12) |
| 222 | anti | (A9) | (D11) | (G12) |
| 223 | syn | (A9) | (D12) | (G12) |
| 224 | anti | (A9) | (D12) | (G12) |
| 225 | syn | (A10) | (D1) | (G1) |
| 226 | anti | (A10) | (D1) | (G1) |
| 227 | syn | (A10) | (D1) | (G2) |
| 228 | anti | (A10) | (D1) | (G2) |
| 229 | syn | (A10) | (D1) | (G3) |
| 230 | anti | (A10) | (D1) | (G3) |
| 231 | syn | (A10) | (D1) | (G9) |
| 232 | anti | (A10) | (D1) | (G9) |
| 233 | syn | (A10) | (D1) | (G10) |
| 234 | anti | (A10) | (D1) | (G10) |
| 235 | syn | (A10) | (D1) | (G11) |
| 236 | anti | (A10) | (D1) | (G11) |
| 237 | syn | (A10) | (D1) | (G12) |
| 238 | anti | (A10) | (D1) | (G12) |
| 239 | syn | (A10) | (D2) | (G2) |
| 240 | anti | (A10) | (D2) | (G2) |
| 241 | syn | (A10) | (D2) | (G3) |
| 242 | anti | (A10) | (D2) | (G3) |
| 243 | syn | (A10) | (D2) | (G9) |
| 244 | anti | (A10) | (D2) | (G9) |
| 245 | syn | (A10) | (D2) | (G10) |
| 246 | anti | (A10) | (D2) | (G10) |
| 247 | syn | (A10) | (D2) | (G11) |
| 248 | anti | (A10) | (D2) | (G11) |
| 249 | syn | (A10) | (D2) | (G12) |
| 250 | anti | (A10) | (D2) | (G12) |
| 251 | syn | (A10) | (D3) | (G3) |
| 252 | anti | (A10) | (D3) | (G3) |
| 253 | syn | (A10) | (D3) | (G9) |
| 254 | anti | (A10) | (D3) | (G9) |
| 255 | syn | (A10) | (D3) | (G10) |
| 256 | anti | (A10) | (D3) | (G10) |
| 257 | syn | (A10) | (D3) | (G11) |
| 258 | anti | (A10) | (D3) | (G11) |
| 259 | syn | (A10) | (D3) | (G12) |
| 260 | anti | (A10) | (D3) | (G12) |
| 261 | syn | (A10) | (D9) | (G9) |
| 262 | anti | (A10) | (D9) | (G9) |
| 263 | syn | (A10) | (D9) | (G10) |
| 264 | anti | (A10) | (D9) | (G10) |
| 265 | syn | (A10) | (D9) | (G11) |
| 266 | anti | (A10) | (D9) | (G11) |
| 267 | syn | (A10) | (D9) | (G12) |
| 268 | anti | (A10) | (D9) | (G12) |
| 269 | syn | (A10) | (D10) | (G10) |
| 270 | anti | (A10) | (D10) | (G10) |
| 270 | syn | (A10) | (D10) | (G11) |
| 272 | anti | (A10) | (D10) | (G11) |
| 273 | syn | (A10) | (D10) | (G12) |
| 274 | anti | (A10) | (D10) | (G12) |
| 275 | syn | (A10) | (D11) | (G11) |
| 276 | anti | (A10) | (D11) | (G11) |
| 277 | syn | (A10) | (D11) | (G12) |
| 278 | anti | (A10) | (D11) | (G12) |
| 279 | syn | (A10) | (D12) | (G12) |
| 280 | anti | (A10) | (D12) | (G12) |

Atropisomeric mixtures of the formula (I) in which A and where appropriate also D and G stand for condensed aromatic ring systems which are capable of the formation of diastereomers and in which an excess of one atropisomer (diastereomer) relative to the other atropisomer (diastereomer) is present are novel and are therefore likewise a subject-matter of the present invention.

The invention therefore furthermore relates to atropisomer mixtures of the formula (1)

Formula (1)

where R, $R^1$, m and n have the same meaning as described above, and the following applies to the other symbols used:

A is on each occurrence, identically or differently, a condensed aryl or heteroaryl group having 9 to 40 aromatic ring atoms, preferably having 14 to 30 aromatic ring atoms, which may be substituted by R or unsubstituted, with the proviso that a group R is bonded in all ortho-positions to the link to B, C, D, E, G or J (and also to the link to other A, if m>1) or a group B, C, D, E, G or J, or that this position is blocked by a part of the condensed aromatic ring system;

B, C, D,

E, G, J are on each occurrence, identically or differently, an aromatic or heteroaromatic ring system having 5 to 40 aromatic ring atoms, which may be unsubstituted or substituted by R, with the proviso that at least one aromatic radical R, which may also be condensed onto the corresponding unit B to J, is present in the ortho-position to the link to A;

characterised in that an atropisomeric excess of one atropisomer of at least 10% is present.

The atropisomer mixture of the formula (1) preferably consists only of the atropisomers of one compound, i.e. it is preferably a mixture of atropisomers without the mixture comprising further components.

Preference is given to an atropisomeric excess of at least 20%, particularly preferably at least 50%, very particularly preferably at least 70%, in particular at least 90%, at least 95% or at least 99% respectively. Greater atropisomeric excesses are preferred since better reproducibility during production and operation of the organic electronic device is thereby ensured.

Preferred condensed aromatic ring systems are those as already described above.

A is particularly preferably selected from the units 9,10-anthracene, pyrene and perylene. Particular preference is furthermore given to the corresponding aza analogues. A is very particularly preferably selected from 9,10-anthracene and pyrene.

B, C, D, E, G and J are particularly preferably, independently of one another, selected from 1-naphthyl, ortho-biphenyl and 1-anthryl, each of which may be substituted by R or unsubstituted. These groups are furthermore particularly preferably selected from the corresponding aza analogues.

Very particular preference is furthermore given to the compounds from Table 2.

The compounds of the formula (1) are usually synthesised by firstly synthesising the mixture of the atropisomers, which are present statistically in a ratio of about 1:1, in accordance with the literature. The enrichment and isolation of one of the atropisomers can be carried out in a subsequent step, for example utilising different solubility, for example by recrystallisation. It may be appropriate here to substitute the compound of the formula (1) in a suitable manner, enabling the solubility of the different atropisomers to be changed to different extents. Thus, it may be possible, for example by means of suitable substitution, to obtain an atropisomer which is readily soluble in a wide range of organic solvents, while the other atropisomer, which is diastereomeric to the first atropisomer, is virtually insoluble in these solvents. Separation of the isomers, which would otherwise only be possible with considerable experimental effort, can in some cases thereby become simple. Further common separation methods of organic chemistry can also be employed, for example column chromatography, preparative HPLC, distillation, sublimation, fractional crystallisation or extraction (for example Soxhlet extraction). If, in addition to the diastereomers, individual enantiomers are to be enriched or isolated, chromatography on chiral solid phases is suitable for this purpose.

For some compounds, in particular those having large substituents, it is possible for one of the atropisomers already to be formed in excess or in substantially pure form directly during the synthesis.

Utilisation of the template effect may also be possible for the synthesis. In this case, one of the possible atropisomers which is already in solution is selected by addition of a template (for example a suitable metal ion) during the synthesis and thus formed in significant excess.

The atropisomer which is not enriched or isolated can be restored to equilibrium with the other atropisomer by re-isomerisation, for example by sufficiently long heating in a suitable solvent, by treatment with ultrasound and/or with microwaves. The isomer separation operation can thus be carried out without loss.

As stated above, it is possible through suitable substitution to obtain readily soluble or insoluble atropisomers of the same compound. In an analogous manner, it is possible, for example through the use of the more soluble atropisomer as monomer, to obtain readily soluble polymers, oligomers or dendrimers without the necessity for many and/or large organic radicals, for example alkyl or alkoxy groups having 4 or more C atoms, which do not contribute to the electronic function of the polymer, but have been necessary to date for the synthesis of soluble conjugated polymers in accordance with the prior art. If, by contrast, use is made of the less soluble atropisomer or a mixture of the two atropisomers which comprises the less soluble atropisomer in equal proportions or in excess, the polymers, oligomers or dendrimers obtained generally also have poor solubility.

The invention therefore furthermore relates to conjugated, partially conjugated or non-conjugated polymers, oligomers or dendrimers containing recurring units which e form atropisomers and are thus capable of the formation of diastereomers, characterised in that an atropisomeric excess of at least 10% is used.

Thus, these recurring units can be copolymerised, inter alia, into polyfluorenes (for example in accordance with EP 842208 or WO 00/22026), polyspirobifluorenes (for example in accordance with EP 707020 or EP 894107), poly-para-phenylenes (for example in accordance with WO 92/18552), polydihydrophenanthrenes (for example in accordance with WO 05/014689), polyphenanthrenes (for example in accordance with DE 102004020298.2), polyindenofluorenes (for example in accordance with WO 04/041901 or WO 04/113412), polycarbazoles, polyanthracenes, polynaphthalenes or polythiophenes (for example in accordance with EP 1028136). Polymers having a plurality of these units or homopolymers of the atropisomeric recurring units are also possible.

It is preferred for the atropisomer used in excess in the polymer, oligomer or dendrimer to have better solubility than the atropisomer not used in excess.

In a preferred embodiment of the invention, the atropisomeric excess in the polymer, oligomer or dendrimer is at least 20%, particularly preferably at least 50%, very particularly preferably at least 70%, in particular at least 90%, at least 95% or at least 99% respectively. Greater atropisomeric excesses are preferred since better solubility of the polymers, oligomers or dendrimers is thereby ensured.

Preference is furthermore given to an organic electronic device, characterised in that one or more layers are coated by means of a sublimation process, in which the materials are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electronic device, characterised in that one or more layers are coated by means of the OVPD (organic vapour phase deposition) process or with the aid of carrier-gas sublimation, in which the materials are generally applied at a pressure between $10^{-5}$ mbar and 1 bar.

Preference is furthermore given to an organic electronic device, characterised in that one or more layers are produced from solution, such as, for example, by spin coating, or using any desired printing process, such as, for example, screen printing, flexographic printing or offset printing, but particularly preferably LITI (light induced thermal imaging, thermal transfer printing) or ink-jet printing.

The emitting devices described above have the following surprising advantages over the prior art which uses mixtures having an atropisomer ratio of about 1:1:

1. The stability of corresponding devices is greater compared with systems in accordance with the prior art, which is particularly evident in a longer lifetime.
2. The organic electronic devices can be produced with better reproducibility since, instead of substance mixtures whose individual components have different sublimation temperatures and different physical properties, use is made of compounds having a great enrichment of one isomer or pure isomers. These also result in more uniform layers in the device and in better reproducibility during operation of the device.
3. In contrast to the compounds used to date, some of which were difficult to purify due to poor solubility, the enrichment enables the isolation of isomers with higher solubility, which can consequently be purified more simply or can also be processed more easily from solution.
4. Surprisingly, it has been found that, in spite of the high temperatures used, the atropisomers are stabile during sublimation in a high vacuum and only isomerise to a very minor extent during vapour deposition, or not at all. This is an essential property for ensuring that the isomer employed is also in the same form in the organic electronic device.
5. During separation of the isomers, the unused isomer does not have to be discarded, but instead can be restored to equilibrium with the other atropisomer by sufficiently long heating in a suitable solvent or other treatment. The isomer separation operation can thus be carried out without loss.

The invention is explained in greater detail by the following examples without wishing to restrict it thereby.

EXAMPLES

The following syntheses were carried out under a protective-gas atmosphere, unless indicated otherwise. The starting materials were purchased from ALDRICH or ABCR (9,10-dibromoanthracene, 4-methylnaphthalene-1-boronic acid, 2-formylboronic acid, 2-methoxybenzeneboronic acid, 2-(methylthio)phenylboronic acid, palladium(II) acetate, tri-o-tolylphosphine, inorganics, solvents).

Example 1

9,10-bis(4-Methylnaphth-1-yl)anthracene
(anthracene derivative A1)

a) Synthesis of the Atropisomer Mixture of Anthracene Derivative A1

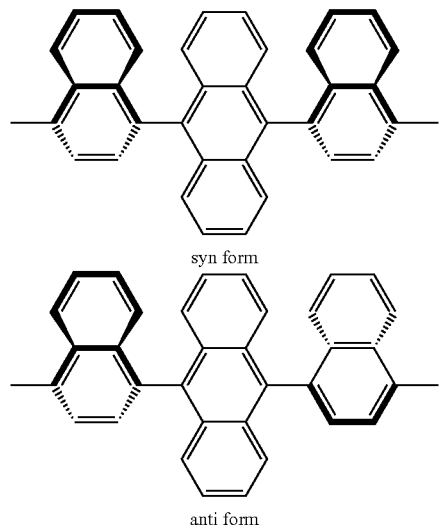

syn form anti form 1.83 g (6 mmol) of tris-o-tolylphosphine and then 225 mg (1 mmol) of palladium(II) acetate were added to a degassed, well-stirred suspension of 74.4 g (400 mmol) of 4-methylnaphthalene-1-boronic acid, 33.6 g (100 mmol) of 9,10-dibromoanthracene and 104.3 g (420 mmol) of potassium phosphate monohydrate in a mixture of 300 ml of toluene, 150 ml of dioxane and 400 ml of water, and the mixture was subsequently refluxed for 16 h. After the reaction mixture had been cooled to room temperature, the precipitated solid was filtered off with suction and washed three times with 200 ml of water each time and three times with 100 ml of ethanol each time. After drying in vacuo (1 mbar; 80° C., 16 h), the product was extracted with chloroform through a glass-fibre extraction thimble (pore size 0.1 μm) in a Soxhlett extractor in order to remove traces of palladium. The chloroform was concentrated to a volume of 100 ml, and 500 ml of ethanol were added. The resultant precipitate was filtered off with suction and washed with ethanol. The yield of crude product A1 was 41.3 g (90 mmol), 90.0% of theory.

b) Determination of the Atropisomer Ratio of the Crude Product of A1

By Means of HPLC:

2 mg of the crude product described above were dissolved in 10 ml of THF. 5 μl of this solution were separated using an Agilent LC 1100 HPLC on a Zorbax SB-CL18 (4.5×75 mm, 3.5 microns) at 40° C. and a flow rate of the eluent (72% of methanol/8% of THF/20% of water) of 1 ml/min.

The retention times [min] and area-% of the atropisomers were:

| Atropisomer 1: | 32.45 min | about 47 area-% |
| Atropisomer 2: | 33.84 min | about 53 area-% |

This corresponds to an atropisomeric excess of about 6%. The UV/VIS spectra of the two atropisomers—taken from the HPLC peaks—are virtually identical.

By Means of $^1$H-NMR Spectroscopy:

The $^1$H-NMR spectra were recorded on a Bruker DMX 500 MHz spectrometer.

The $^1$H-NMR spectrum of the atropisomer mixture described above is complex owing to the substantial overlapping of the signals of atropisomers 1 and 2; however, the relative molar ratio of the atropisomers can be determined from two superimposed, but sufficiently separated doublets, which can be assigned to the 8-naphthyl protons: Atropisomer 1: δ (8-naphthyl proton): 8.21 ppm (d, $^3J_{HH}$=8.3 Hz); about 46% Atropisomer 2: δ (8-naphthyl proton): 8.20 ppm (d, $^3J_{HH}$=8.3 Hz); about 54% c) Preparative Separation of the Atropisomers of A1

Enrichment of Atropisomer 2:

40.0 g of the mixture of the atropisomers of A1 described above as crude product, having a ratio of atropisomer 1 to atropisomer 2 of about 47%:53% were suspended in 2000 ml of N-methylpyrrolidinone (NMP). This suspension was placed in an oil bath at 250° C. After about 10 min., the temperature of the N-methylpyrrolidinone was about 200° C., and the mixture of the atropisomers had dissolved. After slow cooling of the solution, the microcrystalline precipitate formed was filtered off with suction and washed three times with 100 ml of NMP each time and three times with 100 ml of ethanol. The yield was 18.3 g of an enriched mixture of atropisomers 1 and 2 in the ratio about 10%:90%, corresponding to an atropisomeric excess of 2 of 80%.

Enrichment of Atropisomer 1:

300 ml of ethanol were added to the N-methylpyrrolidinone mother liquor from the above recrystallisation. The microcrystalline precipitate formed after standing at room temperature for 16 h was filtered off with suction. The 5.4 g of product obtained in this way consisted of an enriched mixture of atropisomers 1 and 2 in the ratio about 84%:16%, corresponding to an atropisomeric excess of 68%. A further 500 ml of ethanol were added to the mother liquor from the last-mentioned step. The microcrystalline precipitate formed after standing at room temperature for 32 h was filtered off with suction. The 11.3 g of product obtained in this way consisted of an enriched mixture of atropisomers 1 and 2 in the ratio about 96%:4%, corresponding to an atropisomeric excess of 1 of 92%.

Isolation of Pure Atropisomer 2:

10.0 g of the mixture described above, in which atropisomer 2 was enriched to an atropisomeric excess of 80%, were again recrystallised from N-methylpyrrolidinone. To this end, 800 ml of N-methylpyrrolidinone were heated to 190° C. The mixture having an atropisomeric excess of atropisomer 2 of 80% was then added with vigorous stirring. After a clear solution had formed (about 5 min.), the heat source was removed, and the solution cooled to room temperature with stirring (about 16 h). The solid was filtered off with suction and washed with a little N-methylpyrrolidinone. After two recrystallisations, the yield was 7.9 g, with the atropisomeric excess of atropisomer 2 being estimated as at least 98% (ratio 99%:1%) since atropisomer 1 could not be detected in this fraction either by means of HPLC or by means of $^1$H NMR spectroscopy.

d) Comparison of the Solubility of the Atropisomers of A1

Atropisomer 1 is readily soluble in all common polar organic solvents, such as, for example, dichloromethane, chloroform, acetone, THF, DMSO, DMF, NMP, etc. By contrast, atropisomer 2 is only very sparingly soluble in all common organic solvents. It exhibits the best solubility in dipolar aprotic solvents, such as DMF, NMP or DMSO, at the boiling point, from which it can also be recrystallised (see above).

e) Thermal Isomerisation of the Atropisomers of A1

200 mg of atropisomer 2 having an atropisomeric excess of at least 98% were suspended in 10 ml of N-methylpyrrolidinone. This suspension was heated at 200° C. for 6 h. The atropisomeric excess was subsequently determined by means of HPLC (see above); it was 78% with respect to atropisomer 2. By extended heating, it was also possible to produce a mixture having an atropisomer ratio of about 1:1. This shows that an isomer mixture can be produced again from the enriched isomer by means of suitable experimental conditions. The unused isomer therefore does not have to be discarded, but instead can be used further, after isomerisation.

f) Sublimation of the Atropisomers of A1

The sublimation of the atropisomers of A1 was carried out in a static vacuum under the conditions indicated below (Table 3). Surprisingly, it was found that the atropisomers only isomerise to a very minor extent, or not at all, under the sublimation conditions used, as shown by the comparison of the atropisomeric excesses before and after the sublimation. It is furthermore striking that the two atropisomers differ greatly in their sublimation temperatures, which confirms that reproducible production of organic electronic devices is impossible using a mixture of these isomers.

TABLE 3

Sublimation of atropisomers 1 and 2

| Atropisomer | Pressure [mbar] | Subl. temp. [° C.] | Atropisomeric excess before sublimation | Atropisomeric excess after sublimation |
| --- | --- | --- | --- | --- |
| 1 | 5 × 10$^{-5}$ mbar | 320 | 92% | 92% |
| 2 | 5 × 10$^{-5}$ mbar | 370 | 98% | 97% | g) Melting Points and Glass Transition Temperatures of the Atropisomers of A1

The melting points and glass transition temperatures of the two enriched atropisomers of A1 were investigated. It was found that these temperatures differ significantly 30 from one another for the two atropisomers, which confirms the transmorphological properties of the two isomers. The results are shown in Table 4.

TABLE 4

Melting points and glass transition temperatures of atropisomers 1 and 2

| Atropisomer | Atropisomeric excess | Melting point [° C.] | Glass transition temperature [° C.] |
| --- | --- | --- | --- |
| 1 | 92% | 433 | 137 |
| 2 | 97% | 449 | 151 | h) UV/VIS and Photoluminescence Spectra of the Atropisomers of A1

The UV/VIS and photoluminescence spectra of films of the atropisomers of A1 (atropisomer 1 with a 92% atropisomeric excess and atropisomer 2 with a 98% atropisomeric excess) were determined. The results are shown in FIG. 1. It is striking that, although the UV/VIS spectra do not have great differences, the photoluminescence spectra differ considerably from one another. Thus, atropisomer 2 exhibits a structured emission band in the photoluminescence, while atropisomer 1 has a broad, virtually unstructured emission band, which in addition exhibits a significant bathochromic shift.

Example 2

9,10-bis(2-Formylphenyl)anthracene a) Synthesis of the Atropisomer Mixture:

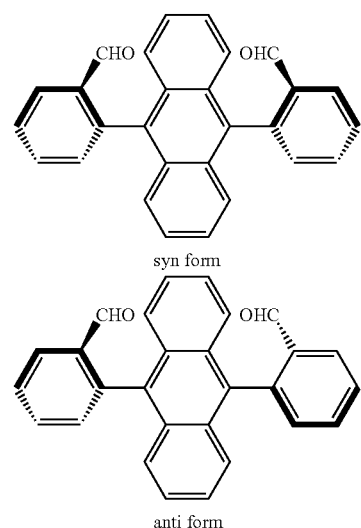

2.3 g (2 mmol) of tetrakistriphenylphosphinopalladium(0) were added to a well-stirred, degassed suspension of 33.6 g (100 mmol) of 9,10-dibromoanthracene, 45.0 g (300 mmol) of 2-formylbenzeneboronic acid and 55.1 g (520 mmol) of sodium carbonate in a mixture of 500 ml of toluene, 150 ml of ethanol and 400 ml of water, and the mixture was refluxed for 48 h. After cooling, 500 ml of ethyl acetate were added, and the org. phase was separated off, washed twice with 500 ml of water, dried over magnesium sulfate and then evaporated to dryness. The residue was dissolved in 500 ml of dichloromethane, filtered through silica gel and again evaporated to dryness, and the residue was taken up in 100 ml of ethanol, the mixture was boiled under reflux and cooled, and the product was filtered off with suction and then washed with a little ethanol. The yield of crude product was 36.7 g (95 mmol), 95.0% of theory.

b) Determination of the Atropisomer Ratio of the Crude Product

By Means of HPLC:

2 mg of the crude product described above were dissolved in 10 ml of THF. 5 µl of this solution were separated using an Agilent LC 1100 HPLC on a Zorbax SB-C18 (4.5×75 mm, 3.5 microns) at 40° C. and a flow rate of the eluent (81% of methanol/9% of THF/10% of water) of 1 ml/min.

The retention times [min] and area-% of the atropisomers were:

| Atropisomer 1: | 13.53 min | about 28 area-% |
| Atropisomer 2: | 21.01 min | about 72 area-% |

This corresponds to an atropisomeric excess of about 44%. The UV/VIS spectra of the two atropisomers—taken from the HPLC peaks—are virtually identical.

By Means of ¹H-NMR Spectroscopy.

The ¹H-NMR spectra were recorded on a Bruker DMX 500 MHz spectrometer. The ¹H-NMR spectrum of the atropisomer mixture described above is complex owing to the substantial overlapping of the signals of atropisomers 1 and 2: however, the relative molar ratio of the atropisomers can be determined from two sufficiently separated singlets, which can be assigned to the formyl protons:

| Atropisomer 1: | δ (formyl proton): | 9.42 ppm; | about 46% |
| Atropisomer 2: | δ (formyl proton): | 9.38 ppm; | about 54% | c) Preparative Separation of the Atropisomers

The preparative separation was carried out by column chromatography on silica gel, eluent n-hexane:ethyl acetate 5:1 (v:v).

Use: 3.0 g of the crude product

Yield: 0.8 g of atropisomer 1

2.0 g of atropisomer 2

Atropisomer 1: ¹H-NMR (CDCl₃): δ [ppm]=9.42 (s, 2H, CHO), 8.26 (d, 2H), 7.86 (dd, 2H), 7.74 (d, 2H), 7.52 (m, 6H), 7.39 (m, 4H).

Atropisomer 2: ¹H-NMR (CDCl₃): δ [ppm]=9.38 (s, 2H, CHO), 8.27 (d, 2H), 7.84 (dd, 2H), 7.74 (d, 2H), 7.52 (m, 6H), 7.39 (m, 4H).

Example 3

9,10-bis(2-Methoxyphenyl)anthracene a) Synthesis of the Atropisomer Mixture:

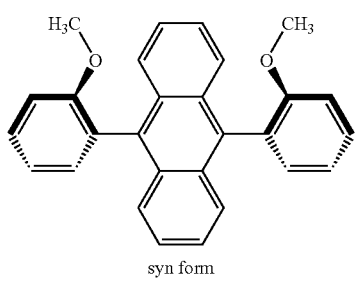

syn form

-continued

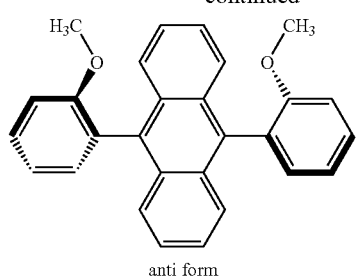

anti form

Synthesis analogous to Example 2. Instead of 2-formylbenzeneboronic acid, 45.6 g (300 mmol) of 2-methoxybenzeneboronic acid were employed, The yield of crude product was 31.0 g (79 mmol), 79.3% of theory.

b) Determination of the Atropisomer Ratio of the Crude Product

By Means of HPLC:

2 mg of the crude product described above were dissolved in 10 ml of THF. 5 µl of this solution were separated using an Agilent LC 1100 HPLC on a Zorbax SB-C18 (4.5×75 mm, 3.5 microns) at 40° C. and a flow rate of the eluent (76.5% of methanol/8.5% of THF/15% of water) of 1 ml/min.

The retention times [min] and area-% of the atropisomers were:

| Atropisomer 1: | 4.78 min | about 48 area-% |
| Atropisomer 2: | 7.09 min | about 52 area-% |

This corresponds to an atropisomeric excess of about 4%. The UV/VIS spectra of the two atropisomers—taken from the HPLC peaks—are virtually identical.

By Means of ¹H-NMR Spectroscopy:

The ¹H-NMR spectra were recorded on a Bruker DMX 500 MHz spectrometer. The ¹H-NMR spectrum of the atropisomer mixture described above is complex owing to the substantial overlapping of the signals of atropisomers 1 and 2; however, the relative molar ratio of the atropisomers can be determined from two sufficiently separated singlets, which can be assigned to the methyl protons:

| Atropisomer 1: | δ (methyl proton): | 3.66 ppm (s); | about 49% |
| Atropisomer 2: | δ (methyl proton): | 3.64 ppm (s); | about 51% | c) Preparative Separation of the Atropisomers

The preparative separation was carried out by column chromatography on silica gel, eluent n-hexane:ethyl acetate 10:1 (v:v).

Use: 3.0 g of the crude product

Yield: 1.4 g of atropisomer 1

1.3 g of atropisomer 2

Atropisomer 1: ¹H-NMR (CDCl₃): δ [ppm]=7.63 (AA'BB', 4H, anthracene), 7.54 (d, 2H), 7.35 (d, 2H), 7.30 (AA'BB', 4H, anthracene), 7.20-7.16 (m, 2H), 3.66 (s, 3H, CH₃).

Atropisomer 2: $^1$H-NMR (CDCl$_3$): δ [ppm]=7.63 (AA'BB', 4H, anthracene), 7.55 (d, 2H), 7.36 (d, 2H), 7.30 (AA'BB', 4H, anthracene), 7.20-7.16 (m, 2H), 3.648 (s, 3H, CH$_3$).

Example 4

9,10-bis[2-(Methylthio)phenyl]anthracene

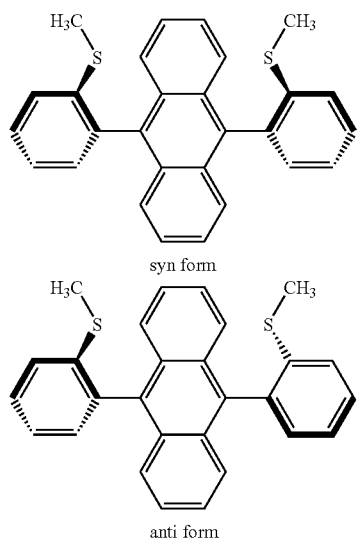

syn form anti form

Synthesis analogous to Example 2. Instead of 2-formylbenzeneboronic acid, 50.4 g (300 mmol) of 2-(methylthio)phenylboronic acid were employed.

The yield of crude product was 27.1 g (64 mmol), 64.3% of theory.

Since only one atropisomer was found with the aid of $^1$H-NMR spectroscopy and HPLC, this was purified by repeated recrystallisation from DMSO (4 ml/g) for the further investigations. The yield was 16.6 g (39 mmol), 39.3% of theory, with a purity of 99.8%. The mother liquor contained a mixture of the atropisomers, which was not investigated further or separated.

b) Determination of the Atropisomer Ratio of the Crude Product

By Means of HPLC:

2 mg of the crude product described above were dissolved in 10 ml of THF. 5 µl of this solution were separated using an Agilent LC 1100 HPLC on a Zorbax SB-C18 (4.5×75 mm, 3.5 microns) at 40° C. and a flow rate of the eluent (72% of methanol/8% of THF/20% of water) of 1 ml/min.

Only one atropisomer was found, the retention times [min] and area-% of the atropisomers were:

| Atropisomer 1: | 6.48 min | 100 area-% |
|---|---|---| c) $^1$H-NMR Spectroscopy:

$^1$H-NMR (benzene-d6): δ [ppm]=7.84 (AA'BB'4H, anthracene), 7.40-7.26 (m, 4H), 7.16-7.10 (m, 16H), 1.72 (s, 6H).

Example 5

Production of OLEDs Comprising Anthracene Derivatives A1 and the Properties Thereof OLEDs were produced by a general process as described in WO 04/058911, which was adapted in individual cases to the particular circumstances (for example layer-thickness variation in order to achieve optimum efficiency or colour). The matrix material used was anthracene derivative A1 as described in Example 1. Both the isolated atropisomers and the atropisomer mixture were used.

OLEDs having the following structure were produced analogously to the above-mentioned general process:

Hole-injection layer (HIL) 20 nm PEDOT (spin-coated from water; purchased from H. C. Starck, Goslar, Germany; poly(3,4-ethylenedioxy-2,5-thiophene))

Hole-transport layer (HTM) 20 nm NaphDATA (vapour-deposited; purchased from SynTec, Wolfen, Germany; 4,4', 4"-tris(N-1-naphthyl-N-phenylamino)triphenylamine)

Hole-transport layer (HTM) 20 nm S-TAD (vapour-deposited; prepared as described in WO 99/12888; 2,2',7,7'-tetrakis(diphenylamino)spiro-9,9'-bifluorene)

Emission layer (EML) 40 nm A1 (atropisomer 1, atropisomer 2 or atropisomer mixture in the weight ratio 1:1, premixed from atropisomers 1 and 2), doped with 5% by weight of dopant D1

Electron conductor (ETL) 20 nm Alq$_3$ (tris(quinolinato)aluminium(III))

Electron-injection layer 1 nm LiF

Cathode 100 nm Al.

These as yet unoptimised OLEDs were characterised by standard methods; for this purpose, the electroluminescence spectra, the photometric efficiency (measured in cd/A), the power efficiency (measured in lm/W) as a function of the luminance, calculated from current/voltage/luminance characteristics (IUL characteristics), and the lifetime were determined. The lifetime is defined as the time after which the initial luminance of the OLED, starting from a particular luminance, has dropped to half while the associated current is maintained.

For better clarity, the structural formula of dopant D1 used is depicted below:

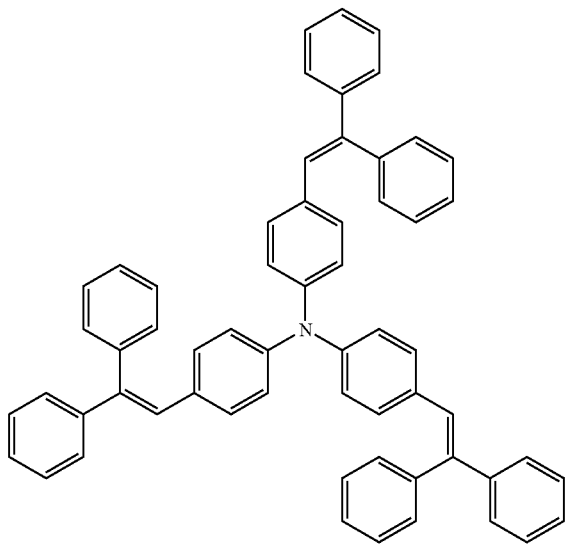

Dopant D1

Current Density as a Function of the Voltage:

FIG. 2 shows the current density/voltage curves of atropisomers 1 and 2, and of the atropisomer mixture in the single-layer structure indicated, layer structure: ITO/PEDOT 20 nm/A140 nm/Ba 4 nm/A1100 nm.

On the one hand atropisomers 1 and 2, on the other hand a mixture of atropisomers 1 and 2, obtained by intimate mixing of equal parts by weight of atropisomers 1 and 2 (referred to as stereoisomer mixture below), were employed. Atropisomers 1 and 2 of A1 exhibit a significantly lower use voltage than the atropisomer mixture. Thus, for example, a current of 10 mA is achieved at voltages of about 6.0 V for atropisomers 1 and 2, while this current only flows at 7.3 V for the atropisomer mixture of A1.

Efficiency and Lifetime:

FIG. 3 shows the photometric efficiency in cd/A (upper curve set) and power efficiency in lm/W (lower curve set) as a function of the luminance of atropisomers 1 and 2 and of the atropisomer mixture (1:1 parts by weight of atropisomers 1 and 2) in devices having the following layer structure: ITO/PEDOT 20 nm/NaphDATA 20 nm/S-TAD 20 nm/A1 doped with 5% of dopant D1 40 nm/Alq$_3$ 20 nm/LiF 1 nm/Al 100 nm. The vapour-deposition temperature of atropisomer 1 was T=172° C., that of stereoisomer 2 was T=197° C. at a chamber pressure of about $5 \times 10^{-6}$ mbar and a vapour-deposition rate of about 4 Å/s. The colour coordinates were in each case CIE: x=0.17, y=0.31. Devices comprising the atropisomer mixture exhibit significantly worse performance data than those of the pure atropisomers, where atropisomer 1 in turn exhibits better performance data here than atropisomer 2.

Similar circumstances are also revealed by the luminance/time curves (FIG. 4). The lifetime of devices comprising the atropisomer mixture is significantly shorter than that of the isolated atropisomers 1 and 2 where stereoisomer 1 in turn exhibits a better lifetime here.

Example 6

OLED Characterisation as a Function of the Vapour-Deposition Duration

FIG. 5 shows the photometric efficiency in cd/A (upper curve set) and power efficiency in lm/W (lower curve set) as a function of the luminance of devices obtained from an atropisomer mixture (1:1 parts by weight of atropisomers 1 and 2) of A1 at the beginning of the device preparation (curves 1) and at the end of the device preparation, after about 90% by weight of the atropisomer mixture employed had evaporated (curves 2). Layer structure: ITO/PEDOT 20 nm/NaphDATA 20 nm/S-TAD 20 nm/A1 doped with 5% of dopant D140 nm/Alq$_3$ 20 nm/LiF 1 nm/Al 100 nm. The colour coordinates were in each case CIE: x=0.17, y 0.31. Devices obtained at the beginning of the device preparation, i.e. those which comprise the atropisomer mixture, exhibit worse performance data by comparison with the devices obtained towards the end of the device preparation and which comprise an atropisomeric excess of atropisomer 2 of 95%, determined by means of HPLC.

Similar circumstances are also revealed by the luminance/time curves (FIG. 6). Devices obtained at the beginning of the device preparation, i.e. those which comprise the atropisomer mixture, exhibit a shorter lifetime compared with the devices obtained towards the end of the device preparation and which comprise an atropisomeric excess of atropisomer 2 of 95%, determined by means of HPLC.

Overall, it is evident that the proportions of the atropisomers and the physical properties of the devices change considerably during the device preparation and that reproducible device production is thus impossible. By contrast, reproducible device production is possible with the isolated atropisomers 1 and 2.

The invention claimed is:

1. An organic electronic device comprising cathode, anode, and at least one layer, said at least one layer comprising at least one atropisomeric organic compound, wherein said at least one atropisomeric organic compound capable of forming diastereomers has an atropisomeric excess of at least 70%, and wherein said at least one atropisomeric organic compound comprises one or more single bonds having an activation energy for rotation about said one or more single bonds of at least 140 kJ/mol.

2. The organic electronic device of claim 1, wherein said organic electronic device is selected from the group consisting of organic polymeric light-emitting diodes, polymeric light-emitting diodes, organic field-effect transistors, organic thin-film transistors, organic light-emitting transistors, organic integrated circuits, organic solar cells, organic field-quench devices, light-emitting electrochemical cells, and organic laser diodes.

3. The organic electronic device of claim 1, wherein said at least one atropisomeric organic compound is a host material for dopants able to emit light from the singlet or triplet state, a dopant, a hole-transport material, a electron-transport material, or a hole-blocking material.

4. The organic electronic device of claim 1, further comprising layers in addition to said at least one layer comprising at least one atropisomeric organic compound.

5. The organic electronic device of claim 1, wherein said at least one atropisomeric organic compound exhibits atropisomerism resulting from hindered rotation about single bonds between two sp$^2$ centers.

6. The organic electronic device of claim 1, wherein said at least one atropisomeric organic compound exhibits atropisomerism resulting from hindered rotation about C—C single bonds.

7. The organic electronic device of claim 1, wherein said at least one atropisomeric organic compound comprises predominantly syn isomer and comprises two single bonds with hindered rotation.

8. The organic electronic device of claim 1, wherein said at least one atropisomeric organic compound comprises predominantly anti isomer and comprises two single bonds with hindered rotation.

9. The organic electronic device of claim 1, wherein said at least one atropisomeric organic compound comprises three single bonds with hindered rotation, wherein said single bonds have a linear or branched arrangement.

10. The organic electronic device of claim 1, wherein said at least one atropisomeric organic compound comprises four single bonds with hindered rotation, wherein said single bonds have a linear or branched arrangement.

11. The organic electronic device of claim 1, wherein said at least one atropisomeric organic compound is a compound of the formula (1)

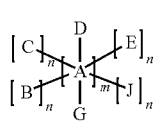

Formula (1)

wherein
- A is on each occurrence, identically or differently, an aryl or heteroaryl group having 5 to 40 aromatic ring atoms, optionally substituted by R, with the proviso that A is substituted with R in all positions ortho to the bond to B, C, D, E, G, or J, or A if m>1, wherein R is optionally also bonded to B, C, D, E, G or J, or, if A is a condensed aromatic ring system, that said positions ortho to the bond to B, C, D, E, G, or J, or A if m>1 is blocked by a part of said condensed aromatic ring system;
- B, C, D, E, G, and J are on each occurrence, identically or differently, an aromatic or heteroaromatic ring system having 5 to 40 aromatic ring atoms, which may be unsubstituted or substituted by one or more radicals R, with the proviso that B, C, D, E, G, and J are substituted with R in at least one position ortho to the link to A or, if B, C, D, E, G or J is a condensed aromatic ring system, that said at least one position ortho to the link to A is blocked by a part of said condensed aromatic ring system;
- R is on each occurrence, identically or differently, F, Cl, Br, I, a straight-chain alkyl or alkoxy group having up to 40 C atoms, optionally substituted by $R^1$, or a branched or cyclic alkyl or alkoxy group having 3 to 40 C atoms, optionally substituted by $R^1$; wherein one or more non-adjacent C atoms are optionally replaced by $N-R^1$, O, S, C=O, O-CO-O, CO-O, SO, $SO_2$, $P(=O)R^1$, $Si(R^1)_2$, $-CR^1=CR^1-$ or $-C\equiv C-$, wherein one or more H atoms are optionally replaced by F, Cl, Br, I or CN, or an aromatic or heteroaromatic ring system having 5 to 40 aromatic ring atoms, optionally substituted by one or more radicals $R^1$, or a combination of two, three, four or five of these systems; and wherein two or more radicals R optionally define a mono- or polycyclic, aliphatic or aromatic ring system;
- $R^1$ is on each occurrence, identically or differently, H or an aliphatic or aromatic hydrocarbon radical having up to 20 C atoms;
- n is on each occurrence, identically or differently, 0 or 1;
- m is on each occurrence, identically or differently, 1, 2, 3, 4 or 5.

12. The organic electronic device of claim 11, wherein at least one carbon atom of a condensed ring system directly on the aromatic or heteroaromatic unit A or at least one carbon atom of R is bonded to A in all positions ortho to the bond to B, C, D, E, G and J.

13. The organic electronic device of claim 11, wherein at least one carbon atom of a condensed ring system directly on the aromatic or heteroaromatic unit B, C, D, E, G or J or at least one carbon atom of R is bonded to B, C, D, E, G and J in at least one position ortho to the bond to A.

14. The organic electronic device of claim 11, wherein at least one of A, D, and G, and optionally at least one of B, C, E and J, is a condensed aromatic or condensed heteroaromatic ring system.

15. The organic electronic device of claim 14, wherein said condensed aromatic ring system comprises between two and eight aromatic or heteroaromatic units condensed onto one another via one or more common edges, which optionally form a common aromatic system and which are optionally substituted by R.

16. The organic electronic device of claim 14, wherein the aromatic and heteroaromatic rings of said condensed aromatic or condensed heteroaromatic ring systems are selected from the group consisting of benzene, pyridine, pyrimidine, pyrazine, pyridazine, pyrrole, and thiophene, each of which are optionally substituted by R.

17. The organic electronic device of claim 14, wherein said condensed aromatic or heteroaromatic ring systems are selected from the group consisting of naphthalene, anthracene, phenanthrene, pyrene, naphthacene, chrysene, pentacene, quinoline, isoquinoline, quinoxaline, phenanthroline, perylene, triphenylene, carbazole, benzothiophene, and dibenzothiophene, each of which are optionally substituted by R.

18. The organic electronic device of claim 14, wherein A is a 9,10-linked anthracene unit.

19. An atropisomer mixture capable of forming diastereomers and having the formula (1)

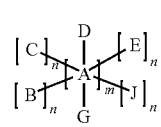

Formula (1)

wherein
- A is on each occurrence, identically or differently, a condensed aryl or heteroaryl group having 9 to 40 aromatic ring atoms, optionally substituted by R, with the proviso that A is substituted by R in all positions ortho to the bond to B, C, D, E, G, or J, or A if m>1, wherein R is optionally also bonded to B, C, D, E, G, or J, or, if A is a condensed aromatic ring system, that said positions ortho to the bond to B, C, D, E, G, or J, or A if m>1 is blocked by a part of said condensed aromatic ring system; and with the further proviso that a single bond about which free rotation is possible is not present in the aromatic or heteroaromatic ring system;
- B, C, D, E, G, and J are on each occurrence, identically or differently, an aromatic or heteroaromatic ring system having 5 to 40 aromatic ring atoms, optionally substituted by R, with the proviso that B, C, D, E, G, and J are substituted with at least one aromatic radical R in the position ortho to the bond to A, wherein said at least one aromatic radical R is optionally also condensed onto B, C, D, E, G, and J;
- R is on each occurrence, identically or differently, F, Cl, Br, I, a straight-chain alkyl or alkoxy group having up to 40 C atoms, optionally substituted by $R^1$, or a branched or cyclic alkyl or alkoxy group having 3 to 40 C atoms, optionally substituted by $R^1$; wherein one or more non-adjacent C atoms are optionally replaced by $N-R^1$, O, S, C=O, O-CO-O, CO-O, SO, $SO_2$, $P(=O)R^1$, $Si(R^1)_2$, $-CR^1=CR^1-$ or $-C\equiv C-$, wherein one or more H atoms are optionally replaced by F, Cl, Br, I or CN, or an aromatic or heteroaromatic ring system having 5 to 40 aromatic ring atoms, optionally substituted by one or more radicals $R^1$, or a combination of two, three, four or five of these systems; and wherein two or more radicals R optionally define a mono- or polycyclic, aliphatic or aromatic ring system;
- $R^1$ is on each occurrence, identically or differently, H or an aliphatic or aromatic hydrocarbon radical having up to 20 C atoms;
- n is on each occurrence, identically or differently, 0 or 1;
- m is on each occurrence, identically or differently, 1, 2, 3, 4 or 5; and
- wherein said atropisomer mixture has an atropisomeric excess of at least 70%, and
- wherein said at least one atropisomeric organic compound comprises one or more single bonds having an activation energy for rotation about said one or more single bonds of at least 140 kJ/mol.

20. The atropisomer mixture of claim 19, wherein A is selected from the group consisting of substituted or unsubstituted 9,10-anthracene, substituted or unsubstituted pyrene, and substituted or unsubstituted perylene.

21. The atropisomer mixture of claim 19, wherein B, C, D, E, G and J are selected, independently of one another, from the group consisting of R-substituted or unsubstituted 1-naphthyl, R-substituted or unsubstituted ortho-biphenyl, and R-substituted or unsubstituted 1-anthryl.

22. Conjugated, partially conjugated, or non-conjugated polymers, oligomers or dendrimers comprising atropisomeric recurring units capable of forming diastereomers, wherein said atropisomeric recurring units have an atropisomeric excess of at least 70%, and wherein said at least one atropisomeric organic compound comprises one or more single bonds having an activation energy for rotation about said one or more single bonds of at least 140 kJ/mol.

23. The polymers of claim 22, wherein said polymers are selected from the group consisting of polyfluorenes, polyspirobifluorenes, poly-para-phenylenes, polydihydrophenanthrenes, polyphenanthrenes, polyindenofluorenes, polycarbazoles, polyanthracenes, polynaphthalenes, polythiophenes, and homopolymers and copolymers thereof.

24. The polymers, oligomers, or dendrimers of claim 22, wherein one of the atropisomers of said atropisomeric recurring units is present in excess, wherein said atropisomer present in excess is more soluble than the atropisomer not in excess.

25. The organic electronic device of claim 1, wherein said at least one atropisomeric organic compound capable of forming diastereomers has an atropisomeric excess of at least 90%.

26. The organic electronic device of claim 1, wherein said at least one atropisomeric organic compound capable of forming diastereomers has an atropisomeric excess of at least 99%.

* * * * *